(12) United States Patent
Uchiyama

(10) Patent No.: US 12,174,535 B2
(45) Date of Patent: Dec. 24, 2024

(54) PRINTER DEVICE, PRINTING METHOD, AND PROGRAM FOR OUTPUTTING AN EXPOSURE START SIGNAL WITHOUT REQUIRING A FILM DETECTION DEVICE

(71) Applicant: FUJIFILM Corporation, Tokyo (JP)

(72) Inventor: Hiroyuki Uchiyama, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 40 days.

(21) Appl. No.: 18/054,036

(22) Filed: Nov. 9, 2022

(65) Prior Publication Data

US 2023/0168579 A1 Jun. 1, 2023

(30) Foreign Application Priority Data

Nov. 30, 2021 (JP) ................. 2021-194504

(51) Int. Cl.
*G03F 7/00* (2006.01)
*G03G 15/08* (2006.01)

(52) U.S. Cl.
CPC ............ *G03F 7/0025* (2013.01); *G03F 7/003* (2013.01); *G03G 15/0855* (2013.01); *G03G 15/0872* (2013.01); *G03G 15/0877* (2013.01)

(58) Field of Classification Search
CPC .......... G03G 15/0877; G03G 15/0872; G03G 15/0855; G03F 7/003; G03F 7/0025
See application file for complete search history.

(56) References Cited

U.S. PATENT DOCUMENTS

| | | | | |
|---|---|---|---|---|
| 8,087,670 B2 * | 1/2012 | Noguchi | ............ | G03G 15/6594 |
| | | | | 271/265.01 |
| 8,762,103 B2 * | 6/2014 | Krucinski | ................ | B65H 7/02 |
| | | | | 702/170 |
| 2001/0033744 A1 * | 10/2001 | Ohmura | ................. | G03B 17/52 |
| | | | | 396/30 |
| 2002/0097383 A1 * | 7/2002 | Futakami | ............... | G03B 27/32 |
| | | | | 355/41 |
| 2019/0084317 A1 | 3/2019 | Fujii et al. | | |

FOREIGN PATENT DOCUMENTS

WO 2018/008223 A1 1/2018

* cited by examiner

*Primary Examiner* — Leon W Rhodes, Jr.
(74) *Attorney, Agent, or Firm* — Studebaker & Brackett PC

(57) ABSTRACT

There are provided a printer device, a printing method, and a program that can appropriately output an exposure start signal without requiring a film detection device. A printer device includes a loading chamber into which a film cartridge is to be loaded, an exposure head device that is disposed to face a photosensitive surface of a film discharged from the film cartridge and exposes the film to light, a spreading roller that splits a developer pod of the film to spread a developer to the film, a transport roller that transports the film, and a load measuring device that measures a change in load occurring in a case where the film enters at least the spreading roller or the transport roller.

16 Claims, 21 Drawing Sheets

PRINTER DEVICE, PRINTING METHOD, AND PROGRAM FOR OUTPUTTING AN EXPOSURE START SIGNAL WITHOUT REQUIRING A FILM DETECTION DEVICE

CROSS-REFERENCE TO RELATED APPLICATION

The present application claims priority under 35 U.S.C § 119(a) to Japanese Patent Application No. 2021-194504 filed on Nov. 30, 2021, which is hereby expressly incorporated by reference, in its entirety, into the present application.

BACKGROUND OF THE INVENTION

1. Field of the Invention

The present invention relates to a printer device, a printing method, and a program.

2. Description of the Related Art

An instant film including a photosensitive sheet, a cover sheet, a developer pod, and a trap portion is known as a photosensitive instant film. The photosensitive sheet is provided on a photosensitive surface (exposure surface) to be exposed to incident lights having three primary colors (red, green, and blue), the cover sheet is provided on an observation surface opposite to the photosensitive surface, the developer pod is provided at one end (front end) of the instant film and contains a developer, and the trap portion is provided at the other end (rear end) of the instant film and collects a surplus developer.

For example, WO2018/008223A discloses a technique relating to printing in a case where the above-mentioned instant film is used.

SUMMARY OF THE INVENTION

Embodiments of the present invention provide a printer device, a printing method, and a program that can appropriately output an exposure start signal without requiring a film detection device.

A printer device according to an aspect of the present invention comprises a loading chamber into which a film cartridge in which a film including a developer pod filled with a developer is housed is to be loaded, an exposure head device that is disposed to face a photosensitive surface of the film discharged from the film cartridge and exposes the film to light, a spreading roller that splits the developer pod of the film to spread the developer to the film, a transport roller that transports the film, and a load measuring device that measures a change in load occurring in a case where the film enters at least the spreading roller or the transport roller.

Preferably, the load measuring device includes a rotary encoder device, and the rotary encoder device is provided at an end portion of a rotating shaft of the transport roller and outputs a pulse signal according to a rotation of the transport roller.

Preferably, the printer device further comprises a processor that controls the exposure head device on the basis of a measurement result of the load measuring device.

Preferably, the processor outputs an exposure start signal to the exposure head device on the basis of the measurement result of the load measuring device and causes the exposure head device to start to perform exposure.

Preferably, the processor outputs the exposure start signal on the basis of a pulse time, which indicates a time interval between pulses of the pulse signal, and a first threshold value.

Preferably, the processor outputs the exposure start signal in a case where the pulse time exceeds the first threshold value a specified number of times in a row.

Preferably, the processor sets the first threshold value on the basis of the measurement result of the load measuring device obtained in a first period where the film does not yet enter the transport roller after the transport of the film is started from the film cartridge.

Preferably, the processor detects a timing at which the film enters the spreading roller on the basis of the measurement result, and outputs the exposure start signal.

Preferably, the processor outputs the exposure start signal on the basis of an increment and a decrement of a pulse time that indicates a time interval between pulses of the pulse signal.

Preferably, the processor detects a timing at which the film enters the transport roller on the basis of the measurement result, and outputs the exposure start signal.

Preferably, the processor controls exposure, which is performed by the exposure head device after the output of the exposure start signal, in synchronization with the pulse signal output from the rotary encoder device.

Preferably, an exposure range of the exposure head device in a width direction of the film is larger than the photosensitive surface of the film.

Preferably, the spreading roller is provided on a downstream side of the exposure head device in a transport direction of the film.

Preferably, the transport roller is disposed between the exposure head device and the spreading roller.

Preferably, an interval between the exposure head device and the spreading roller is equal to or less than an interval between the developer pod and the photosensitive surface of the film.

Preferably, the printer device further comprises an imaging lens and an imaging element that captures an image of a subject formed by the imaging lens.

The above-mentioned printer device is attached to a camera with a printer device according to another aspect of the present invention.

A printing method according to another aspect of the present invention is a printing method of a printer device including a loading chamber into which a film cartridge in which a film including a developer pod filled with a developer is housed is to be loaded, an exposure head device that is disposed to face a photosensitive surface of the film discharged from the film cartridge and exposes the film to light, a spreading roller that splits the developer pod of the film to spread the developer to the film, and a transport roller that transports the film. The printing method comprises a step of measuring a change in load occurring in a case where the film enters at least the spreading roller or the transport roller by a load measuring device of the printer device, and a step of outputting an exposure start signal to the exposure head device on the basis of a measurement result of the load measuring device, to cause the exposure head device to start to perform exposure by a processor of the printer device.

A program according to still another aspect of the present invention is a program causing a printer device to perform a printing method. The printer device includes a loading chamber into which a film cartridge in which a film including a developer pod filled with a developer is housed is to be loaded, an exposure head device that is disposed to face a photosensitive surface of the film discharged from the film cartridge and exposes the film to light, a spreading roller that splits the developer pod of the film to spread the developer to the film, and a transport roller that transports the film. The program causes the printer device to perform a step of measuring a change in load occurring in a case where the film enters at least the spreading roller or the transport roller by a load measuring device of the printer device, and a step of outputting an exposure start signal to the exposure head device on the basis of a measurement result of the load measuring device, to cause the exposure head device to start to perform exposure by a processor of the printer device.

DESCRIPTION OF THE PREFERRED EMBODIMENTS

A printer device, a printing method, and a program according to preferred embodiments of the present invention will be described below with reference to the accompanying drawings.

Printer Device

Figure 1:
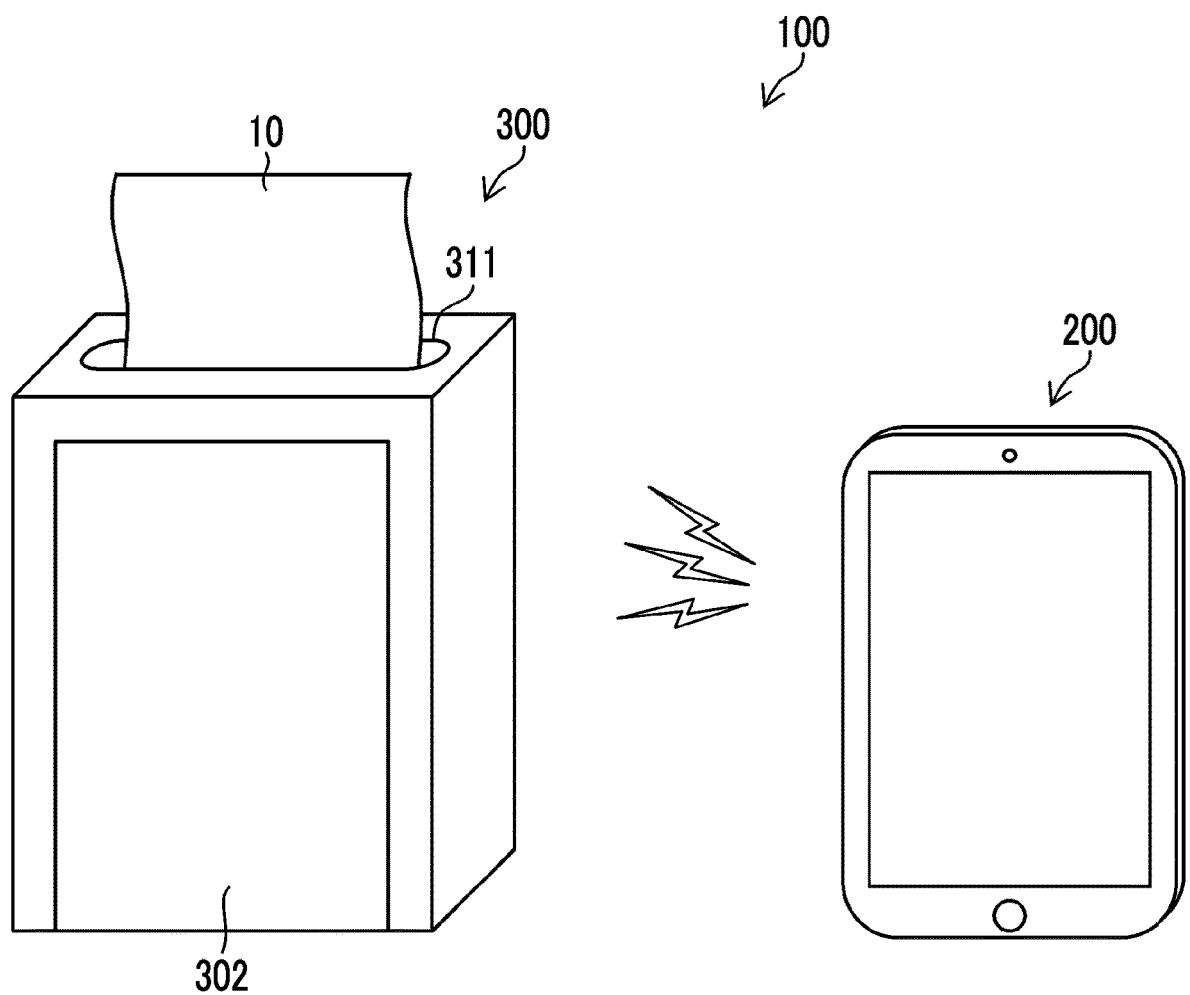
FIG. 1 is an external view showing the configuration of a printing system including a printer device.

FIG. 1 is an external view showing the configuration of a printing system including a printer device according to an embodiment of the present invention, and the printing system 100 shown in FIG. 1 includes a smartphone 200 and a printer device 300.

The smartphone 200 comprises an imaging optical system and a wireless communication unit (not shown), and transmits image data of an image, which is captured via an imaging optical system by a user, and a print instruction for the image data to the printer device 300 using the wireless communication unit. In this case, the data of a so-called template (characters, numbers, symbols, illustrations, and the like) may be transmitted together and may be printed together with the image. Any type of commonly used smartphone can be used as the smartphone 200 as long as imaging and wireless communication can be performed. A dedicated application may be installed in the smartphone 200 to manage and transmit data, such as the image data, the print instruction, and the template described above.

The printer device 300 can perform wireless communication, and makes a print on an instant film 10, which is used as a printing medium to be described later, using the image data, the template (in a case where the image data are transmitted from the smartphone 200), and the print instruction that are received from the smartphone 200 by the wireless communication unit 75 (see FIG. 9; image data input unit). The instant film 10 on which a print has been made is discharged from a film discharge port 311 provided at an end portion of the printer device 300. The printer device 300 comprises an operation unit and a display unit (not shown).

A device that transmits image data to the printer device 300 is not limited to the smartphone 200, and may be a digital camera, a portable information terminal, a tablet terminal, or the like having a wireless communication function. Further, the printer device 300 is not limited to a case where the printer device 300 receives image data using wireless communication, and may be adapted to receive image data via a communication cable or a recording medium, such as a memory card.

Figure 2:
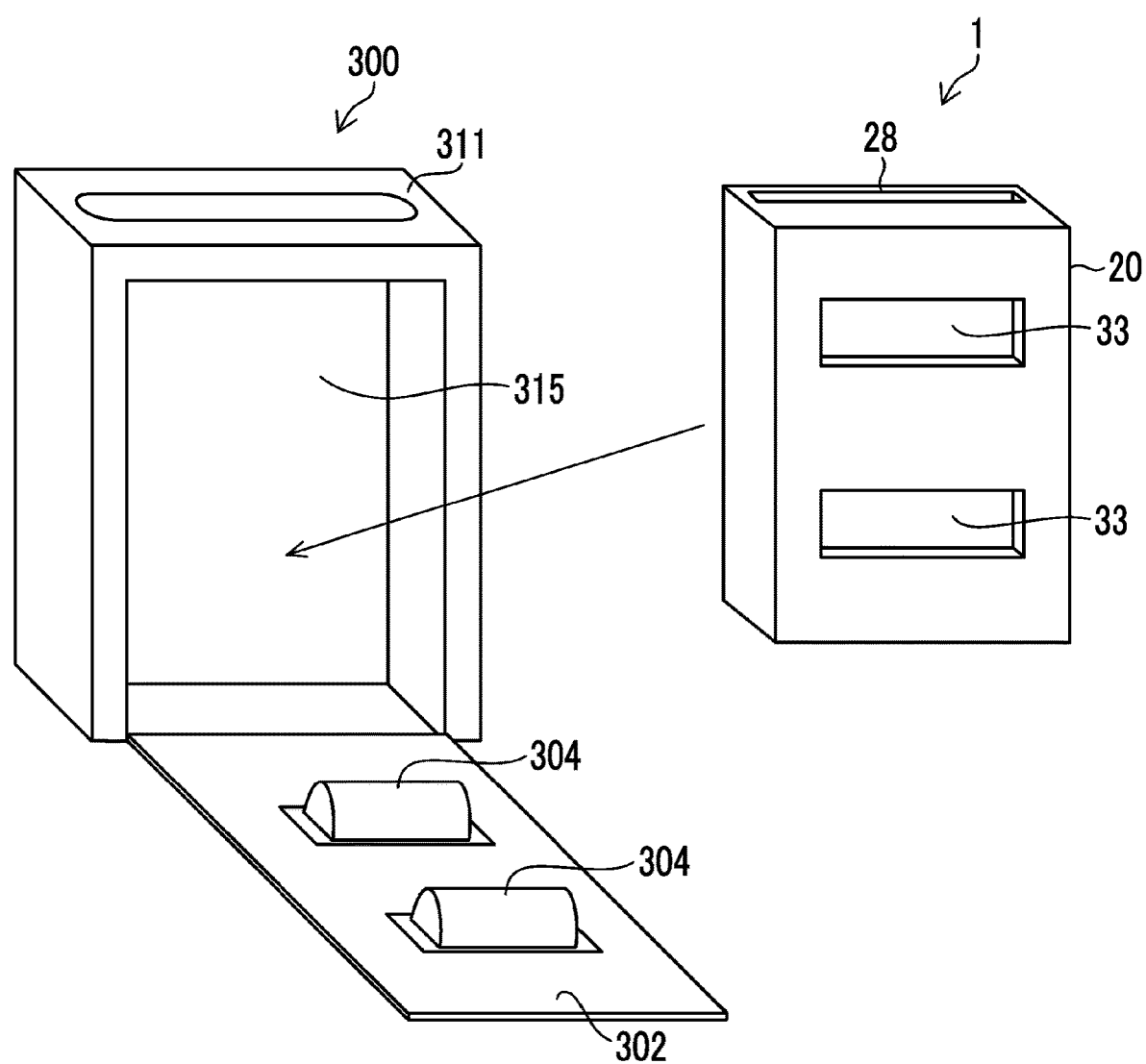
FIG. 2 is a diagram showing an aspect in which a film cartridge is loaded into the printer device.

FIG. 2 is a diagram showing an aspect in which a film cartridge 1 is loaded into the printer device 300. The printer device 300 is provided with a loading chamber 315, and the film cartridge 1 is loaded into the loading chamber 315. The loading chamber 315 is provided with an openable and closable lid member 302, and a user closes the lid member 302 after the loading of the film cartridge 1. The lid member 302 is provided with push-up members 304 biased by springs (not shown). Accordingly, in a case where the film cartridge 1 is loaded into the loading chamber 315 and the lid member 302 is closed, the push-up members 304 are inserted into push-up member-insertion portions 33 provided on the back surface of the film cartridge 1, push a light shielding sheet 50 (see FIG. 3) up to a front side (a side opposite to opening surfaces of the push-up member-insertion portions 33), and press instant films 10 against the inner surface of a case 20.

Configuration of Film Cartridge

Figure 3:
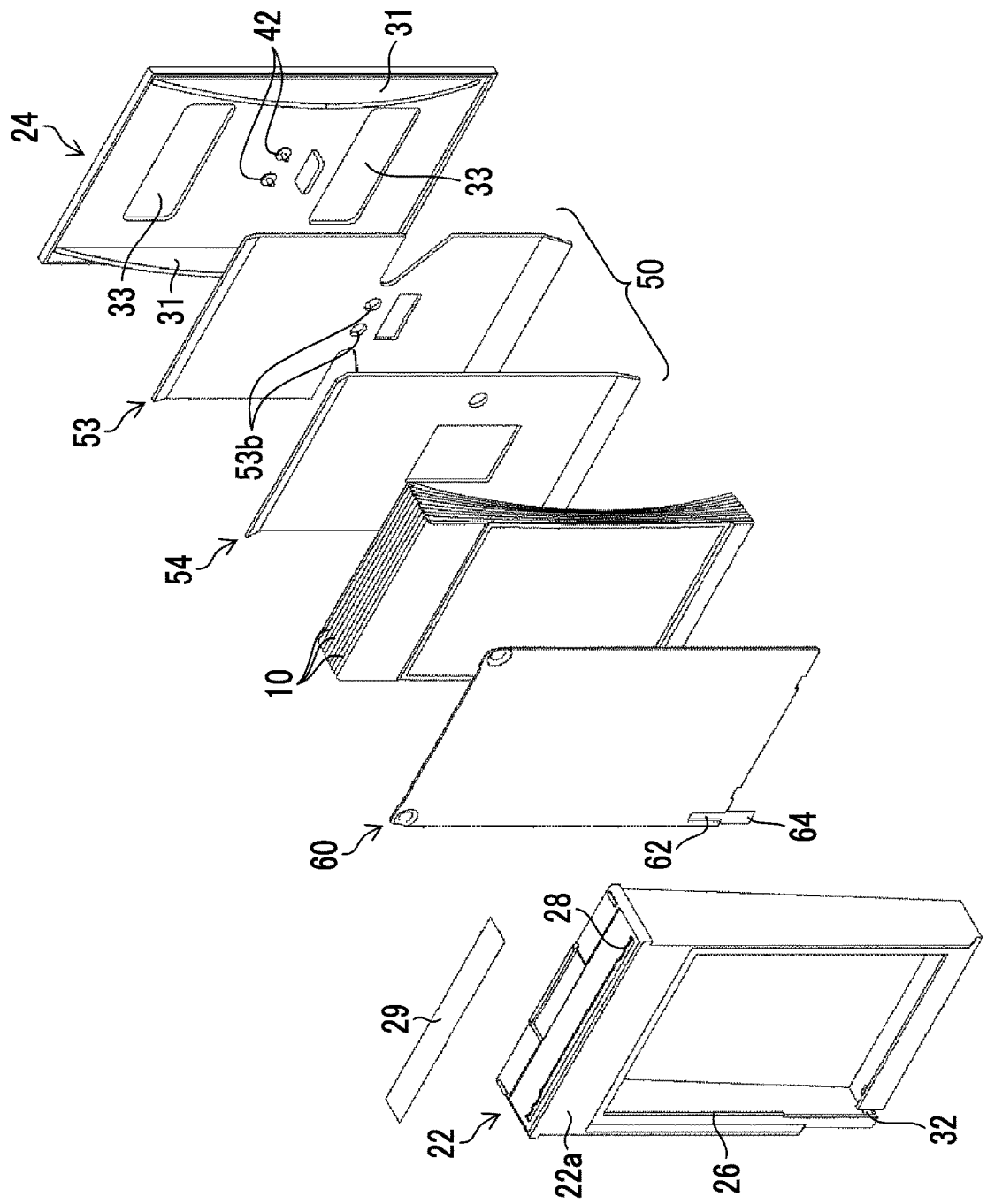
FIG. 3 is an exploded perspective view of the film cartridge.

FIG. 3 is an exploded perspective view of the film cartridge 1. The film cartridge 1 comprises instant films 10, a case 20 (see FIG. 2) that houses the instant films 10, a light shielding sheet 50, and a film cover 60. The case 20 includes a case body 22 and a case lid 24 that closes the back surface of the case body 22.

The case body 22 has the shape of a flat rectangular box of which a back surface portion is open. The case body 22 is provided with an exposure opening portion 26 that allows an exposure region of the instant film 10 to be exposed to light, a discharge port 28 that is used to discharge an instant film 10, a case flap member 29 that is used to shield the discharge port 28 from light, and a claw opening portion 32 into which a claw member 72 (see FIGS. 9 to 12) is to be inserted. The exposure opening portion 26 has a shape corresponding to the shape of an exposure portion 12 (see FIG. 4) of the instant film 10. The exposure opening portion 26 is disposed at a position where the exposure portion 12 of the instant film 10 housed in the case 20 is exposed.

The discharge port 28 is provided at a top surface portion of the case body 22, and has the shape of a slit having a size that allows the instant film 10 to pass. The discharge port 28 is disposed at a position where an instant film 10 positioned at the top in a stacking direction can be discharged.

The case flap member 29 is formed of a rectangular film piece, and is adhered to the case body 22 along one long side to openably and closably shield the discharge port 28.

Figure 6:
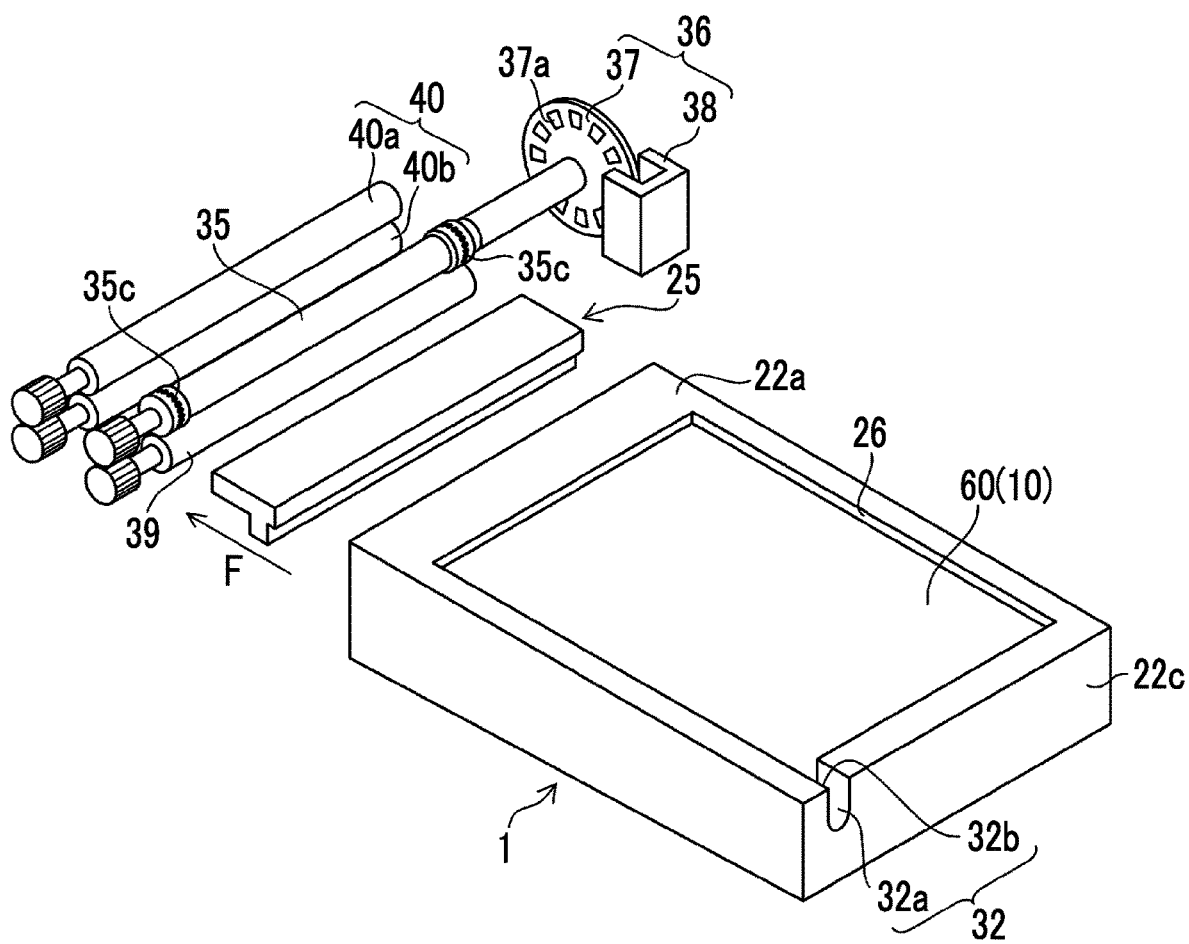
FIG. 6 is a perspective view of a transport mechanism for the instant film and a film cover.

As shown in FIG. 6, the claw opening portion 32 is provided at a front portion 22a and a bottom portion 22c of the case body 22. The claw opening portion 32 has the shape of a slit, and is linearly disposed at the front portion 22a from the bottom portion 22c as a base point. As shown in FIG. 6, the bottom portion 22c of the case body 22 is provided with a notch-shaped inlet portion 32a that forms a part of the claw opening portion 32. The front portion 22a of the case body 22 is provided with a slit-shaped passage portion 32b that forms a part of the claw opening portion 32. The passage portion 32b is linearly disposed in a transport direction F of the instant film 10. An end point of the passage portion 32b forms the exposure opening portion 26. That is, the claw opening portion 32 is disposed in a form where the bottom portion 22c and the exposure opening portion 26 of the case body 22 are linearly connected to each other. The width of the claw opening portion 32 is a width that allows the claw member 72 to be inserted into the claw opening portion 32.

The case lid 24 has the shape of a rectangular plate, and is attached to the back surface portion of the case body 22 to close the open back surface of the case body 22. The case lid 24 is provided with a pair of push-up member-insertion portions 33, a pair of film support portions 31, and a pair of light shielding sheet-attachment portions 42. The push-up member-insertion portions 33 are opening portions into which the above-mentioned push-up members 304 (see FIG. 2) are to be inserted. The film support portions 31 are support portions that support the film cartridge 1 housed in the case 20. The film support portions 31 are formed of arc-shaped thin plates, and are disposed on the inside of the case lid 24 along both long sides of the case lid 24. The instant films 10 housed in the case 20 are supported in a convex shape by the film support portions 31. The light shielding sheet-attachment portions 42 are attachment portions for the light shielding sheet 50. The light shielding sheet-attachment portions 42 are formed of columnar pins and are arranged in parallel at the central portion of the case lid 24.

The light shielding sheet 50 supports the instant films 10 in the case 20 and blocks light. The light shielding sheet 50 is formed by a combination of a first light shielding sheet 53 that has a function as a leaf spring and a second light shielding sheet 54 that has a function as a support plate. The light shielding sheet-attachment portions 42 of the case lid 24 are inserted into fixing portions 53b of the first light shielding sheet 53 and inserted portions are adhered to the fixing portions 53b, so that the light shielding sheet 50 of which the first light shielding sheet 53 and the second light shielding sheet 54 are integrated with each other is attached to the case lid 24. The light shielding sheet 50 attached to the case lid 24 is disposed between the pair of film support portions 31.

In a case where the film cartridge 1 is loaded into the loading chamber 315 and the lid member 302 is closed as described above, the push-up members 304 are inserted into the push-up member-insertion portions 33. The light shielding sheet 50 is pushed by the push-up members 304 inserted into the push-up member-insertion portions 33, and press the instant films 10 against the inner surface of the case 20. In this case, the first light shielding sheet 53 is elastically deformed, elastically presses the instant films 10, and presses the instant films 10 against the inner surface of the case 20.

The film cover 60 blocks light from the exposure opening portion 26. As shown in FIG. 3, the film cover 60 is disposed to overlap the top of the stacked instant films 10 and is housed in the case 20. The film cover 60 is provided with a notched portion 62 and a film cover-skirt part 64. The notched portion 62 has the shape of a slit, and is provided at a rear end portion of the film cover 60. The notched portion 62 is disposed in parallel to a feed direction of the film cover 60. A position where the notched portion 62 is disposed is set to the same position as the claw opening portion 32. Accordingly, in a case where the film cover 60 is housed in the case 20, the notched portion 62 is disposed to continue to the claw opening portion 32. The notched portion 62 has the same width as the claw opening portion 32. The "same width" includes substantially the same width.

The film cover-skirt part 64 is an example of a light shielding member, is attached to the film cover 60, and blocks light from the claw opening portion 32 and the notched portion 62. The film cover-skirt part 64 is formed of a rectangular sheet piece. The film cover-skirt part 64 is attached to the back surface portion of the film cover 60, and shields the notched portion 62. In this case, the film cover-skirt part 64 is attached such that a part of the film cover-skirt part 64 protrudes from the film cover 60. A protruding portion of the film cover-skirt part 64 functions as a skirt portion for shielding the inlet portion 32a of the claw opening portion 32. In a case where the film cover 60 is housed in the case 20, the inlet portion 32a of the claw opening portion 32 is shielded by the skirt portion and light from the inlet portion 32a is blocked.

The film cover-skirt part 64 is attached to the film cover 60 by adhesion. Further, the skirt portion of the film cover-skirt part 64 is adhered to the inner surface of the case 20, so that the film cover 60 attached to the case 20 is fixed. In a case where the claw member 72 starts to transport the film cover 60, the film cover-skirt part 64 is moved together with the film cover 60 and is discharged from the discharge port 28.

Instant Film

Figure 4:
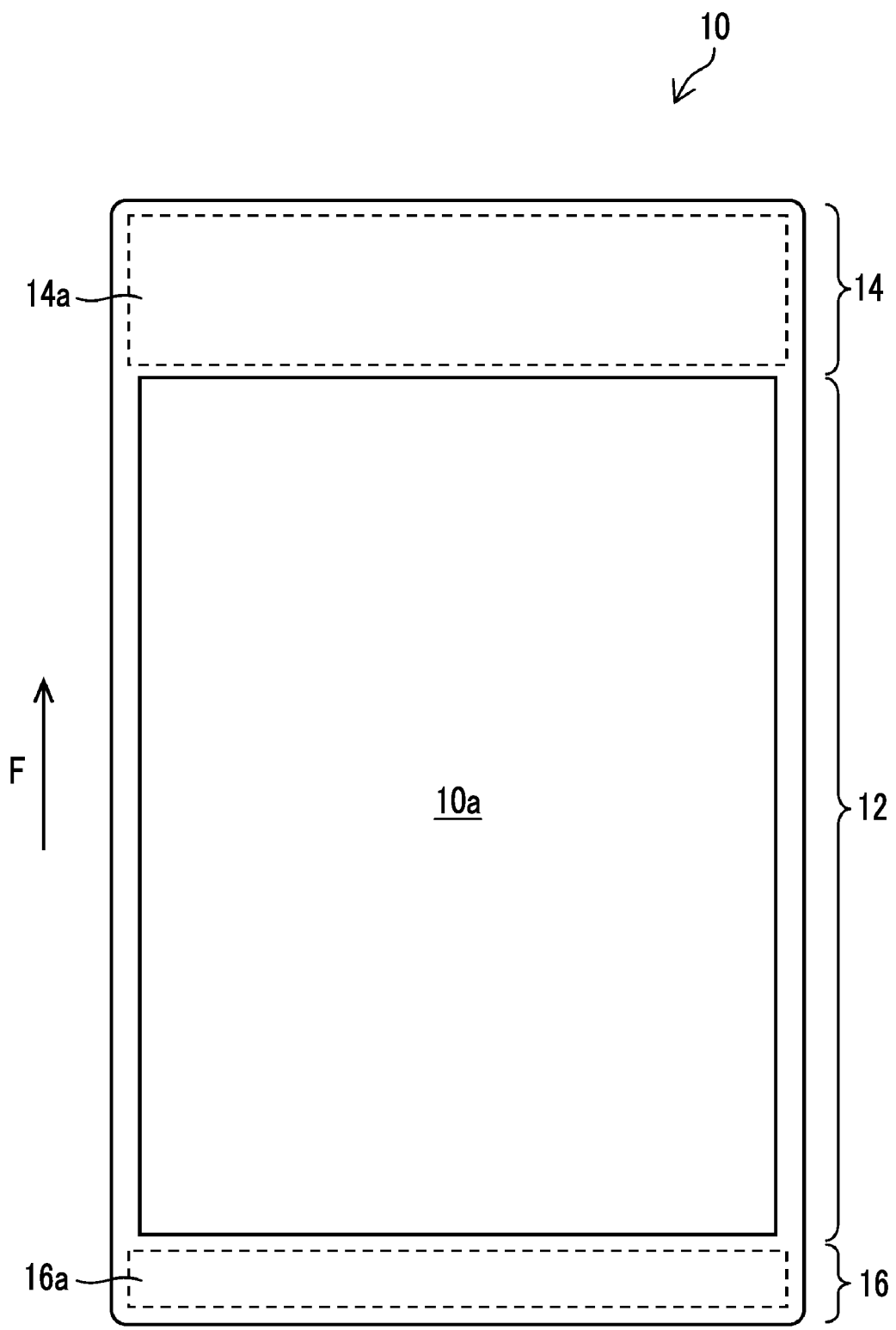
FIG. 4 is a plan view of an instant film viewed from a side of a photosensitive surface.
Figure 5:
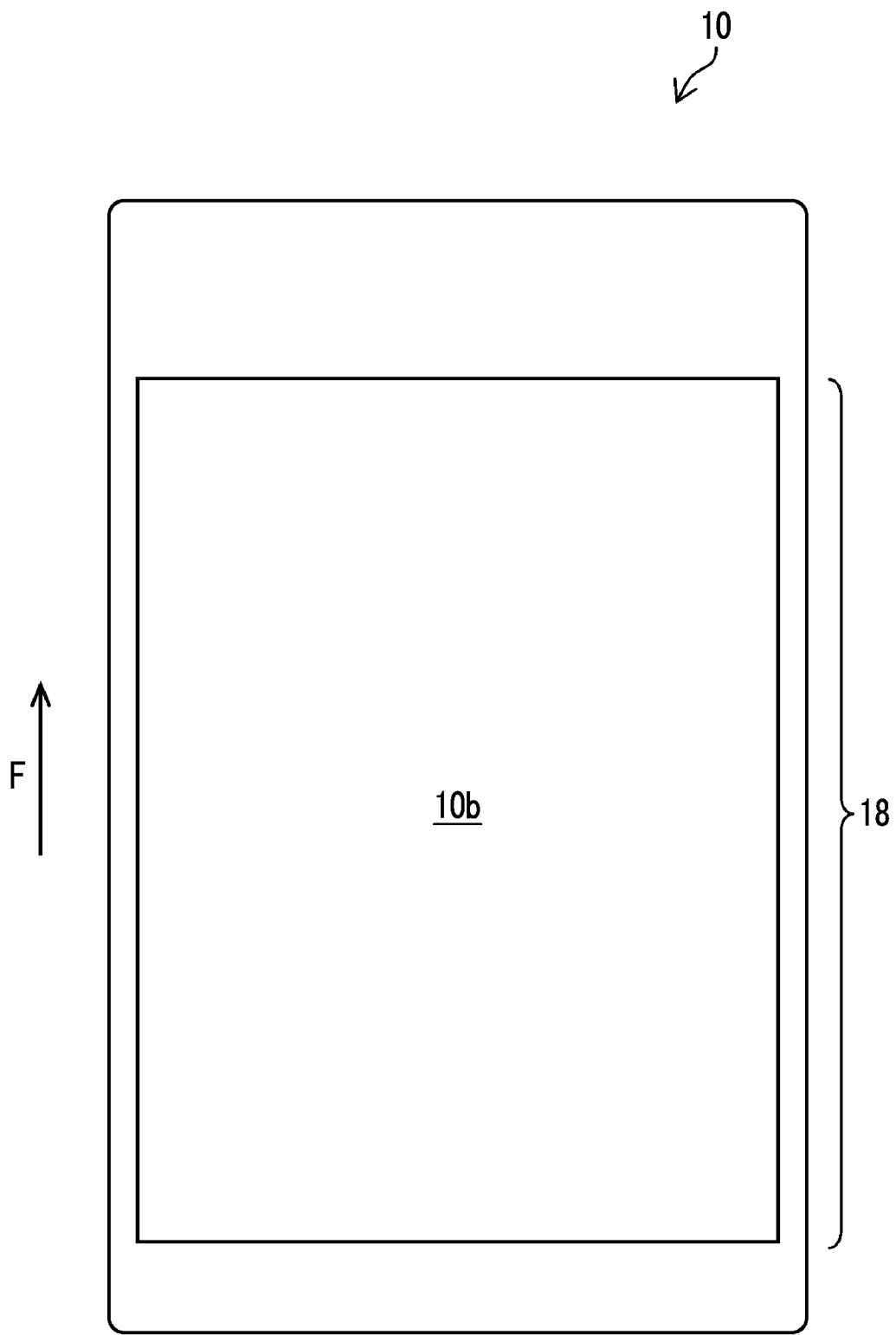
FIG. 5 is a plan view of the instant film viewed from a side of an observation surface.

The instant film 10 is a publicly known self-developing instant film 10, and has the shape of a rectangular card. As shown in FIGS. 4 and 5, one surface of the instant film 10 is formed as a photosensitive surface (exposure surface) (photosensitive sheet) 10a and the other surface thereof is formed as an observation surface (cover sheet) 10b. The instant film 10 of this embodiment is a positive sensitizer that increases the density of each of a red light, a green light, and a blue light as the amounts of incident lights having three primary colors (red, green, and blue) are larger.

FIG. 4 is a plan view of the instant film 10 viewed from a side of the photosensitive surface 10a. In FIG. 4, a direction indicated by an arrow is the feed direction (transport direction F) of the instant film 10. The feed direction is synonymous with the use direction of the instant film 10. In a case where the instant films 10 are housed in the case 20, the feed direction of the instant films 10 is the discharge direction of the instant films 10. The photosensitive surface 10a is provided with an exposure portion 12, a pod portion 14, and a trap portion 16. The exposure portion 12 is an exposure region, and is disposed between the pod portion 14 and the trap portion 16 as a rectangular region. The pod portion 14 is disposed on a front end side of the instant film 10 in the feed direction. A developer pod 14a filled with a developer is built in the pod portion 14. The trap portion 16 is disposed on a rear end side of the instant film 10 in the feed direction. An absorbent material 16a is built in the trap portion 16.

FIG. 5 is a plan view of the instant film 10 viewed from a side of the observation surface 10b. In FIG. 5, a direction indicated by an arrow is the feed direction (transport direction F) of the instant film 10. The observation surface 10b is provided with an observation portion 18 that forms an observation region of a captured image. The observation portion 18 is disposed to correspond to the exposure portion 12 of the photosensitive surface.

The instant film 10 is exposed to light and the developer of the pod portion 14 is then spread to the exposure portion 12, so that the instant film 10 is subjected to a development treatment. The instant film 10 is made to pass between a pair of spreading rollers 40 (see FIGS. 6 to 8), so that the developer of the pod portion 14 is squeezed and spread to the exposure portion 12. In this case, a surplus developer is trapped by the trap portion 16.

The film cover 60 and the instant films 10 are housed in the case body 22 and the back surface of the case body 22 is closed with the case lid 24, so that the film cartridge 1 is assembled. In this case, first, the film cover 60 is housed in the case body 22. Then, the skirt portion of the film cover-skirt part 64 is adhered to the inner surface of the case 20. Accordingly, the exposure opening portion 26 and the claw opening portion 32 are shielded by the film cover 60. After that, the instant films 10 are housed in the case body 22 in a state where the instant films 10 are stacked. The instant films 10 are stacked such that the photosensitive surfaces 10a (see FIG. 4) face upward. Then, the instant films 10 are housed in the case body 22 such that the photosensitive surfaces 10a face a side of the exposure opening portion 26. Accordingly, the film cover 60 and the instant films 10 are housed in the case body 22 in a state where the film cover 60 is placed on the photosensitive surface 10a of the instant film 10 positioned at the top. After that, the back surface of the case body 22 is closed with the case lid 24 to which the light shielding sheet 50 is attached. Thus, the assembly of the film cartridge 1 is completed.

Both a form in which the film cartridge 1 is used in a state where the film cover 60 is removed and a form in which the film cartridge 1 is used in a state where the film cover 60 is not removed can be applied. However, in the printer device 300 according to this embodiment, the film cartridge 1 is used in a state where the film cover 60 is removed (discharged) after the film cartridge 1 is loaded into the printer device 300. In this case, after being transported from the case 20, the instant film 10 is exposed to light by an exposure head device 25 (see FIGS. 6 and 7), which is disposed to face the photosensitive surface of the instant film 10, and a developer is spread to the instant film 10 by the spreading rollers 40 (see FIGS. 6 and 7). As a result, a print is made on the instant film 10. Transport and exposure (print) are sequentially performed from the instant film 10 positioned at the top in the case to the instant film 10 positioned at the bottom. The transport, discharge, and exposure of the film cover 60 and the instant film 10 will be described later.

Main Configuration of Printer Device

Figure 7:
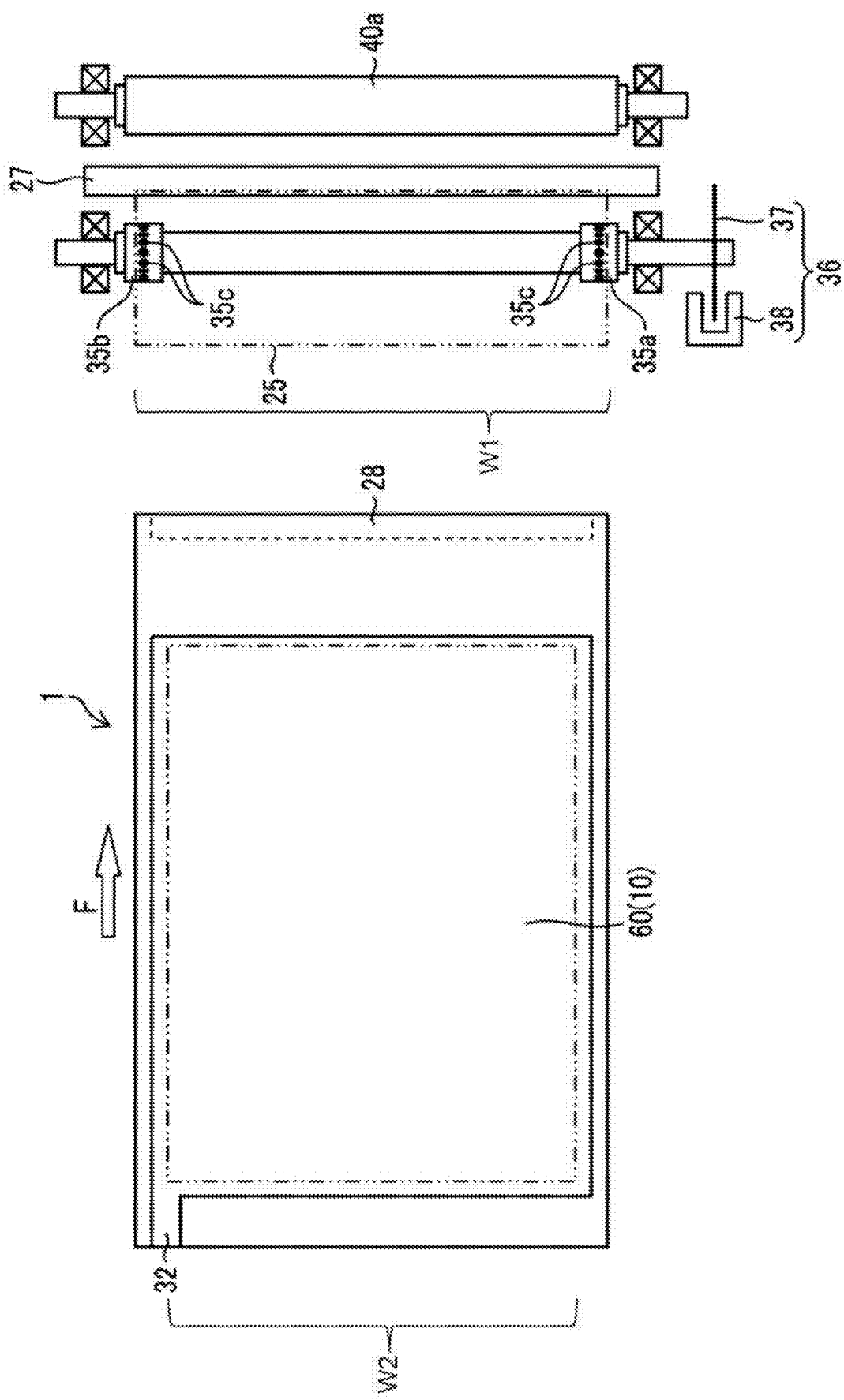
FIG. 7 is a plan view of the transport mechanism for the instant film and the film cover.

Next, the arrangement of main components of the printer device 300 related to the transport, discharge, and exposure of the film cover 60 and the instant film 10 will be described. FIG. 6 is a perspective view showing the arrangement of components related to transport, discharge, and exposure, and FIG. 7 is a top view showing a state shown in FIG. 6. In FIGS. 6 and 7, components that are not objects to be described will be omitted as appropriate and the shapes, dimensions, and arrangement of the components will be simply shown as appropriate. Further, the schematic configuration of a control system of the printer device 300 is shown in FIG. 9.

As shown in FIGS. 6 and 7, an exposure head device 25 (line head), transport rollers (a capstan roller 35 and a pinch roller 39), a film discharge guide 27, and a pair of spreading rollers 40 (a roller 40a and a roller 40b) are arranged on the downstream side of the film cartridge 1 in the transport direction F of the film cartridge 1 in this order from the upstream side toward the downstream side. The positions of the respective components are fixed. Here, an interval between the exposure head device 25 and the spreading rollers 40 is set to be equal to or less than an interval between the developer pod 14a and the photosensitive surface 10a of the instant film 10. In FIG. 6, the film discharge guide 27 is not shown and the disposition of the exposure head device 25 is also changed as appropriate.

Exposure Head and Exposure Head Drive Unit

The exposure head device 25 is a line-type exposure head, and is disposed such that the longitudinal direction of the exposure head device 25 is a direction orthogonal to the transport direction F of the film cover 60 and the instant film 10. An exposure range of the exposure head device 25 in a width direction W1 of the instant film 10 is designed to be larger than a width W2 of the photosensitive surface 10a of the instant film 10. LED arrays (not shown) in which minute light-emitting diodes (LEDs) emitting red, green, and blue lights by pixels are arranged in a longitudinal direction are provided in the exposure head device 25, and light emitted from the LED array corresponding to each color is transmitted through a microlens array (not shown) provided on the front surface of the LED array and is applied onto the same line of the instant film 10. Accordingly, the instant film 10 is simultaneously exposed to three color lights for each line, and exposure corresponding to a line image for one line is performed by single exposure performed by the exposure head device 25.

An exposure head drive unit 73 (see FIG. 9) drives the exposure head device 25 on the basis of the image data received from the smartphone 200. In this case, the exposure head drive unit 73 receives an exposure start signal from a system controller (processor) 45 on the basis of encoder pulse signals output from a rotary encoder 36 as described later, and controls the timing and the like of the exposure of the line images performed by the exposure head device 25.

In the printer device 300, print light is applied onto the photosensitive surface 10a of the instant film 10, which is transported by the transport rollers (the capstan roller 35 and the pinch roller 39), line by line by the exposure head device 25 having the above-mentioned configuration and the exposure head drive unit 73 and an image is printed on the instant film 10. In a case where the printer device 300 receives the data of the above-mentioned template from the smartphone 200, the printer device 300 prints the received template on the instant film 10 together with the image.

Capstan Roller

The capstan roller 35 is connected to a direct current motor (DC motor) 30 as an electric motor via a power transmission mechanism, such as a reduction gear train (not shown), provided in a capstan roller drive unit 34 (see FIG. 9), and a rotational drive force of the DC motor 30 is transmitted to the capstan roller 35 via the reduction gear train. Further, the capstan roller 35 is provided on the side of the photosensitive surface 10a of the instant film 10. As shown in FIG. 7, the capstan roller 35 is disposed near a light-emitting portion of the exposure head device 25. A pair of disc-shaped rollers 35a and 35b for gripping end portions of the film cover 60 and the instant film 10 is disposed at end portions of the capstan roller 35, and the rollers 35a and 35b reliably grip the end portion of the instant film 10 using a plurality of minute protrusions 35c formed on the surfaces of the rollers.

Rotary Encoder Device

Figure 8:
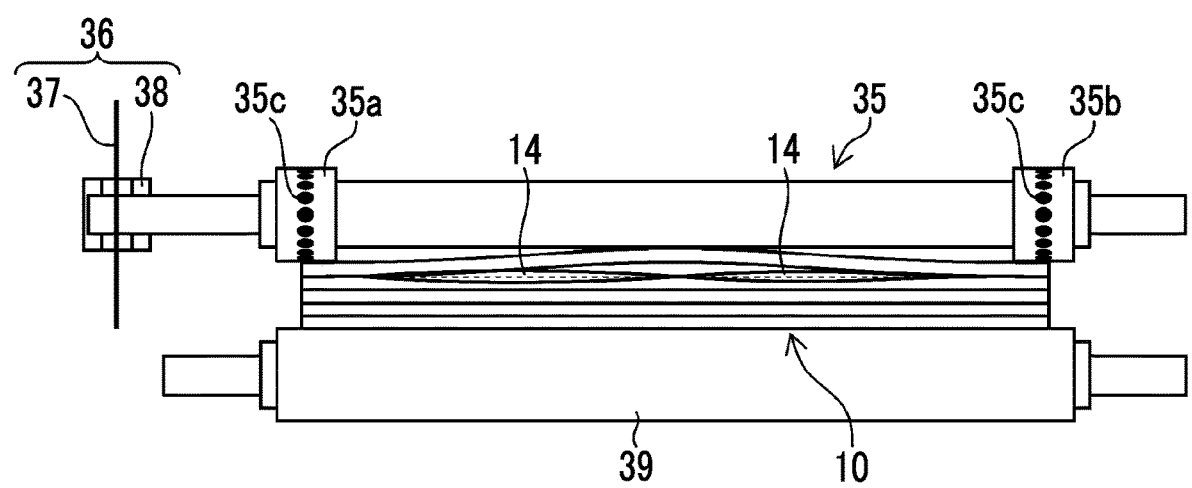
FIG. 8 is a front view of a main portion of the transport mechanism for the instant film and the film cover.

As shown in FIGS. 6 to 8, a rotary slit plate (disc) 37, which forms an optical rotary encoder (encoder) 36, is disposed at an end portion of a rotating shaft of the capstan roller 35, and a detection unit 38 including a light-emitting element formed of a light-emitting diode or the like and a light-receiving element, such as a photodiode, with the rotary slit plate 37 interposed therebetween is fixed.

200 slits 37a (FIG. 6) having a slit width of 100 µm and a pitch between the slits of 200 µm are formed at a peripheral portion of the rotary slit plate 37 of this embodiment.

In a case where the rotary slit plate 37 is rotated with the rotation of the rotating shaft of the capstan roller 35, whenever the slit 37a formed in the rotary slit plate 37 passes between the light-emitting element and the light-receiving element, light applied to the rotary slit plate 37 from the light-emitting element is transmitted through the slit 37a and is incident on the light-receiving element and an electrical signal corresponding to the amount of incident light is output from the light-receiving element. Accordingly, electrical signals (triangular wave-shaped electrical signals) having the same period as the period of the slits 37a passing by the detection unit 38 are output from the detection unit 38 of the rotary encoder 36.

The rotary encoder 36 includes a comparator that amplifies the triangular wave-shaped electrical signals output from the detection unit 38 and shapes the waveform of the electrical signals into rectangular waves (pulse signals), and outputs encoder pulse signals having a period corresponding to the rotational speed of the rotary slit plate 37 (capstan roller 35) (the transport speed of the instant film 10).

Encoder signals are input to an encoder signal processing device 52 from the rotary encoder 36, and the encoder signal processing device 52 detects pulse signals (the rise and/or fall of pulse signals) included in the encoder signals and outputs encoder pulse signals to a measurement unit 49b and the system controller 45 on the basis of the detected pulse signals. The instant film 10 is transported by a predetermined distance for each pulse signal of the encoder pulse signal output in this way. For example, the instant film 10 is designed to be transported by 80 µm per pulse signal. Further, in a case where an encoder pulse time (pulse time) indicating a time interval between pulses of the encoder pulse signals is measured, the transport speed of the instant film 10 can be measured. Furthermore, although described later, a change in load during the transport of the instant film 10 can also be measured from a change in encoder pulse time.

The system controller 45 controls the timing of print (the timing of exposure) of the line images performed by the exposure head device 25 as described later in synchronization with the encoder pulse signals input from the encoder signal processing device 52.

Pinch Roller

For example, the pinch roller 39 is made of an elastic material, such as hard urethane, and is disposed to face the capstan roller 35. Further, the pinch roller 39 is driven and rotated by the capstan roller 35. Coil springs (not shown) are connected to both end portions of the pinch roller 39 and the pinch roller 39 is usually in contact with the capstan roller 35 due to the biasing of the coil springs. Since the pinch roller 39 and the capstan roller 35 can transport the instant film 10 to the spreading rollers 40 by rotating while pinching the instant film 10 (see FIG. 8), the pinch roller 39 and the capstan roller 35 function as transport rollers. The instant film 10 transported by the pinch roller 39 and the capstan roller 35 enters the spreading rollers 40 via the film discharge guide 27 provided on the downstream side.

Spreading Roller

As shown in FIG. 6, two spreading rollers 40 are formed as one set and are disposed to face each other. Each of the spreading rollers 40 is formed of, for example, a metal member and is formed to have the same diameter as the capstan roller 35. One roller 40a of the set of spreading rollers 40 is disposed on the same side as the capstan roller 35 and is connected to the DC motor 30 via a power transmission mechanism, such as a reduction gear train (not shown), and a torque limiter of a spreading roller drive unit 41 (see FIG. 9), and the rotational drive force of the DC motor 30 is transmitted to the roller 40a. Since the torque limiter is provided, torque generated by the spreading rollers 40 can be regulated in a case where the torque generated by the spreading rollers 40 is equal to or higher than set torque. Further, coil springs (not shown) are connected to both ends of the roller 40b facing the roller 40a like the pinch roller 39, and the roller 40b is driven and rotated by the roller 40a provided on a stationary side with the instant film 10 interposed between the rollers 40a and 40b with the biasing forces of the coil springs. The spreading rollers 40 crush the pod portion 14 provided on the instant film 10 to split a sealed portion of the developer pod 14a, cause a developer present inside the developer pod 14a to flow out of the pod portion 14 while pressurizing and sending the instant film 10, and uniformly spread the developer between the photosensitive sheet and the cover sheet (see FIG. 8).

Load Measuring Device

A load measuring device 49 (see FIG. 9) measures a change in load during the transport of the instant film 10 that occurs in a case where the instant film 10 enters the spreading rollers 40 or the transport rollers (the capstan roller 35 and the pinch roller 39).

The load measuring device 49 includes the rotary encoder 36 and the encoder signal processing device 52 described above and a measurement unit 49b to be described below. The rotary encoder 36 and the encoder signal processing device 52 form a rotary encoder device 49a.

The measurement unit 49b (see FIG. 9) measures an encoder pulse time, which is a time between pulses, as a measurement result on the basis of the encoder pulse signals input from the encoder signal processing device 52. Then, the measurement unit 49b outputs the encoder pulse time to the system controller 45. The system controller 45 detects a change in load during the transport of the instant film 10 on the basis of the received encoder pulse time.

Transport of Film Cover and Instant Film

In a case where an unused film cartridge 1 is loaded into the printer device 300, the system controller 45 drives and controls the DC motor 30 via a motor driver 46 in order to detect the loading of the unused film cartridge 1 and automatically transport (discharge) the film cover 60. Further, in a case where the system controller 45 receives image data and a print instruction from the smartphone 200, the system controller 45 drives and controls the DC motor 30 via the motor driver 46 in order to expose an unexposed instant film 10 to light while transporting the unexposed instant film 10, develop the instant film 10, and spread the developer to the instant film 10.

DC power is supplied to the motor driver 46 from a battery or an alternating current (AC) adapter (not shown), and the motor driver 46 supplies drive power having a predetermined voltage to the DC motor 30 on the basis of a drive instruction input from the system controller 45. In this embodiment, a constant voltage (for example, 5 V) is applied to the DC motor 30 from the motor driver 46 during the transport of the film cover 60 and the instant film 10 and speed control, such as speed feedback, is not performed. Accordingly, an inexpensive film transport device is formed. Since the film cover 60 and the instant film 10 are transported in the same way, the transport of the instant film 10 will be described below as a representative example.

The system controller 45 sends signals to an exposure control unit 47 and a line memory 48. The rotational drive force of the DC motor 30 is transmitted to a claw drive unit 71, such as a parallel link mechanism or a cam mechanism, which reciprocates the claw member 72, so that the claw member 72 is reciprocated. In a case where the claw member 72 is moved forward, the claw member 72 enters through the claw opening portion 32 formed at the film cartridge 1 and is locked to the rear end of the instant film 10 (see FIG. 10). Then, the claw member 72 sends the front end of the instant film 10 in the transport direction F from the discharge port 28. Further, the capstan roller 35 starts to be rotated by the drive of the DC motor 30, and the pinch roller 39 is driven and rotated by the rotation of the capstan roller 35.

The instant film 10 is moved in the transport direction F as the claw member 72 is moved. Further, the system controller 45 starts to count the encoder pulse signals input from the encoder signal processing device 52 in response to the rotation of the transport roller (capstan roller 35). The encoder pulse signals start to be counted in response to the rotation of the transport roller in this embodiment, but the present invention is not limited thereto. For example, the system controller 45 may start to count the encoder pulse signals in response to the movement of the claw member 72. Exposure and transport are controlled on the basis of the count number of the encoder pulse signals.

Figure 10:
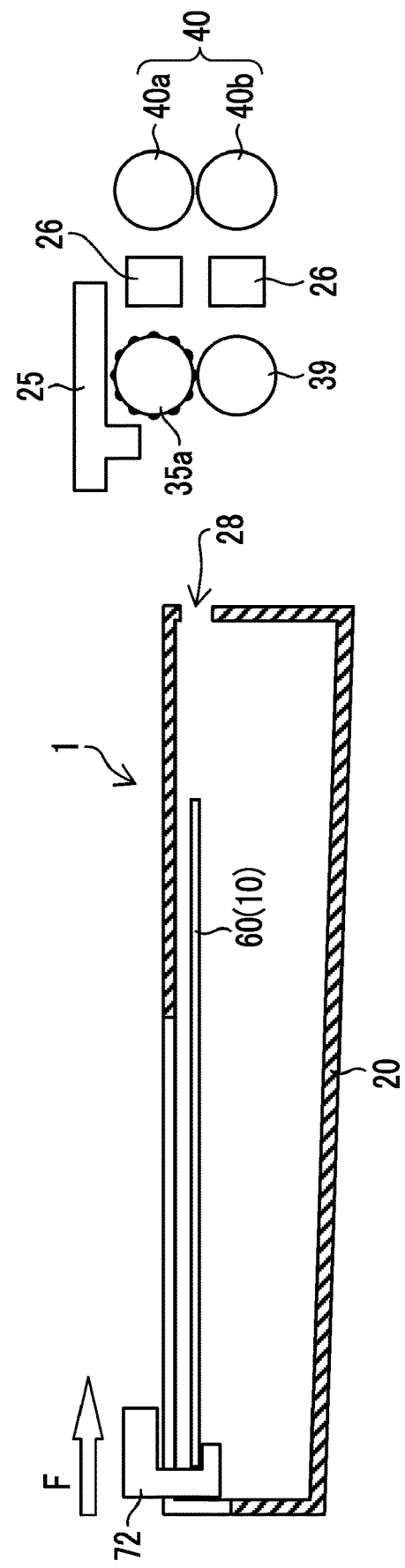
FIG. 10 is a diagram showing an aspect of the transport of the instant film and the film cover.
Figure 11:
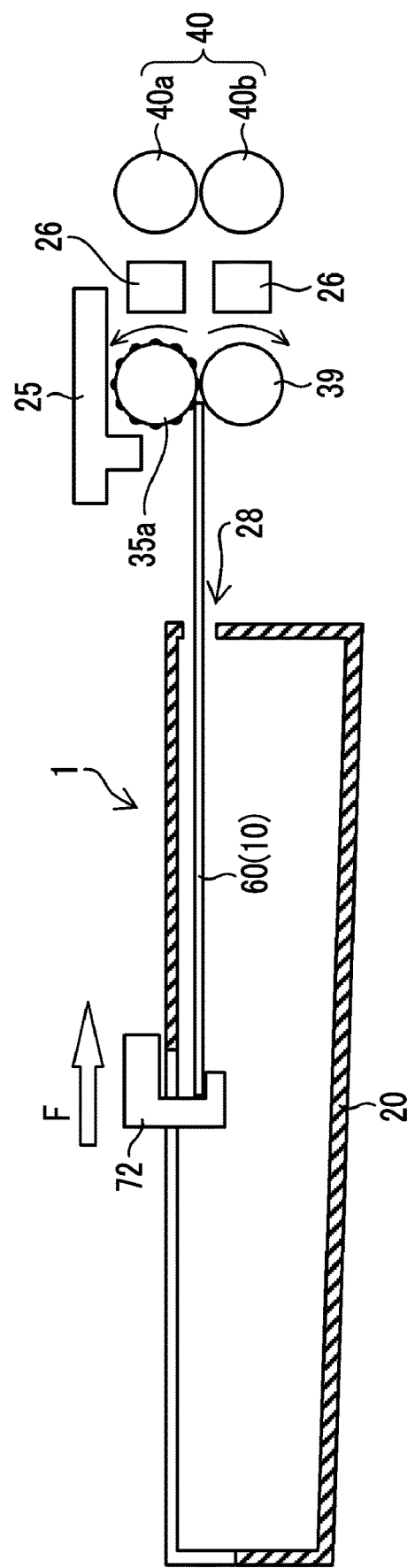
FIG. 11 is a diagram showing an aspect of the transport of the instant film and the film cover.

The claw member 72 continues to move from a state shown in FIG. 10 ("initial state"), and sends the instant film 10 into a gap between the capstan roller 35 and the pinch roller 39 (see FIG. 11). In a state shown in FIG. 11 ("transport roller-entry state"), the instant film 10 starts to be nipped between the capstan roller 35 and the pinch roller 39. Then, the instant film 10 is delivered to the capstan roller 35 and the pinch roller 39 from the claw member 72. During this delivery of the instant film 10, the instant film 10 is transported by the capstan roller 35 and the pinch roller 39 in addition to the claw member 72.

Figure 12:
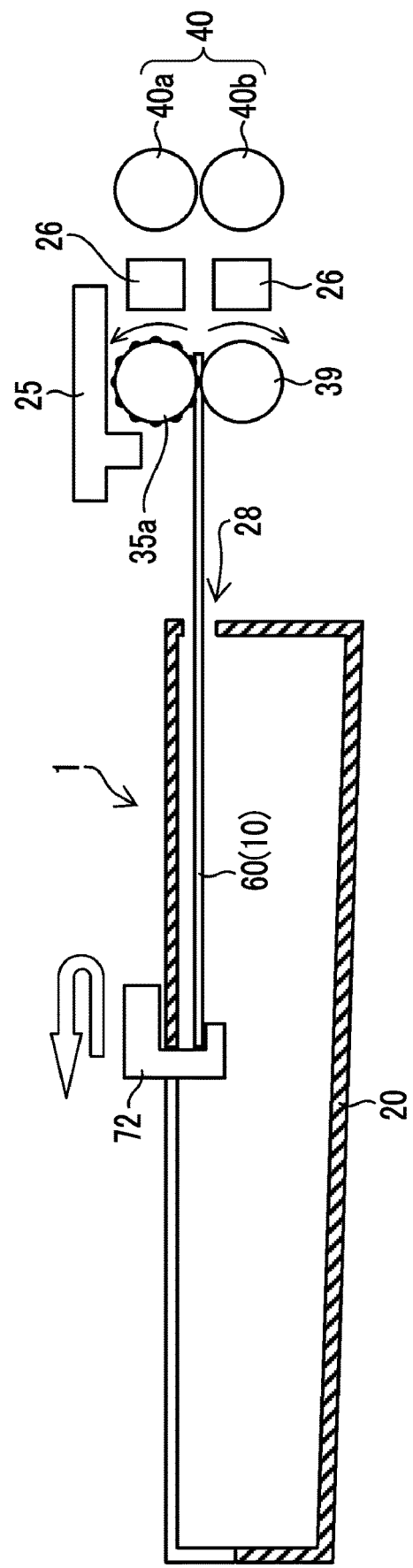
FIG. 12 is a diagram showing an aspect of the transport of the instant film and the film cover.
Figure 13:
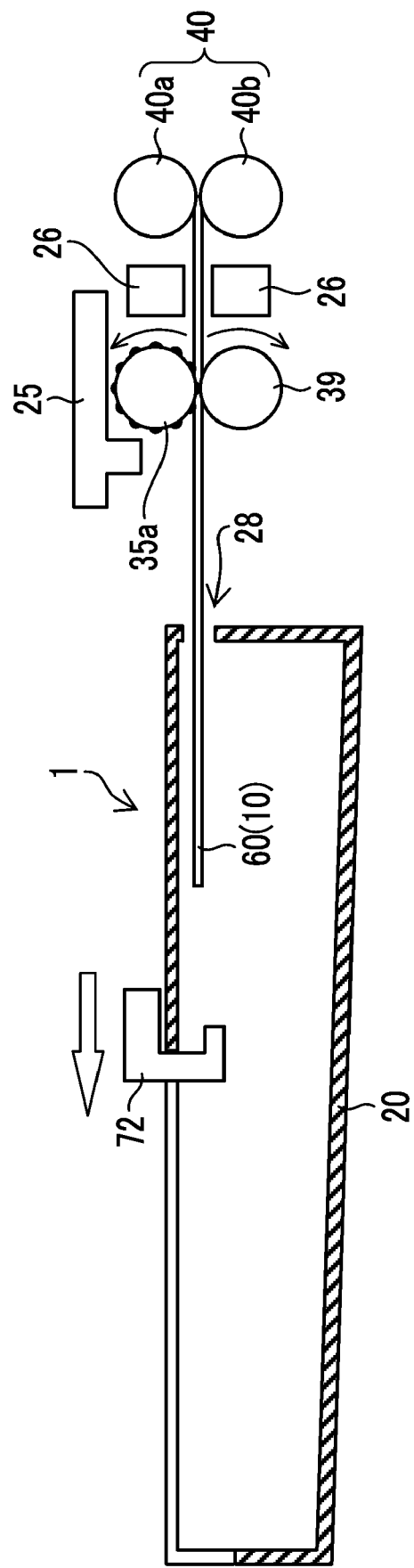
FIG. 13 is a diagram showing an aspect of the transport of the instant film and the film cover.

After that, the instant film 10 continues to be transported, and, the instant film 10 is completely nipped between the capstan roller 35 and the pinch roller 39 in a state where the claw member 72 enters an end of a movement range (a state shown in FIG. 12 (fully entering state)). Accordingly, the delivery of the instant film 10 ends, and the claw member 72 starts to retreat in a direction opposite to the transport direction F. After being delivered, the instant film 10 continues to be transported by the capstan roller 35 and the pinch roller 39. Then, the instant film 10 starts to enter the spreading rollers 40 (a state shown in FIG. 13 (spreading roller-entry state)). In a case where the instant film 10 enters the spreading rollers 40, the pod portion 14 (and the developer pod 14*a*) is then split as described above, so that a developer is spread.

In the above-mentioned transport, the movement range (a distance between a position shown in FIG. 10 and a position shown in FIG. 12) and the movement speed of the claw member 72 can be set by using gears, cam members, link members, and the like (not shown) in the claw drive unit 71 in addition to the rotational speed of the DC motor 30. Likewise, the rotational speed of the capstan roller 35 can also be set by using gears and the like (not shown) in the capstan roller drive unit 34 in addition to the rotational speed of the DC motor 30.

Encoder Pulse Signal

Next, the encoder pulse signals detected by the encoder signal processing device 52 will be described.

Figure 14:
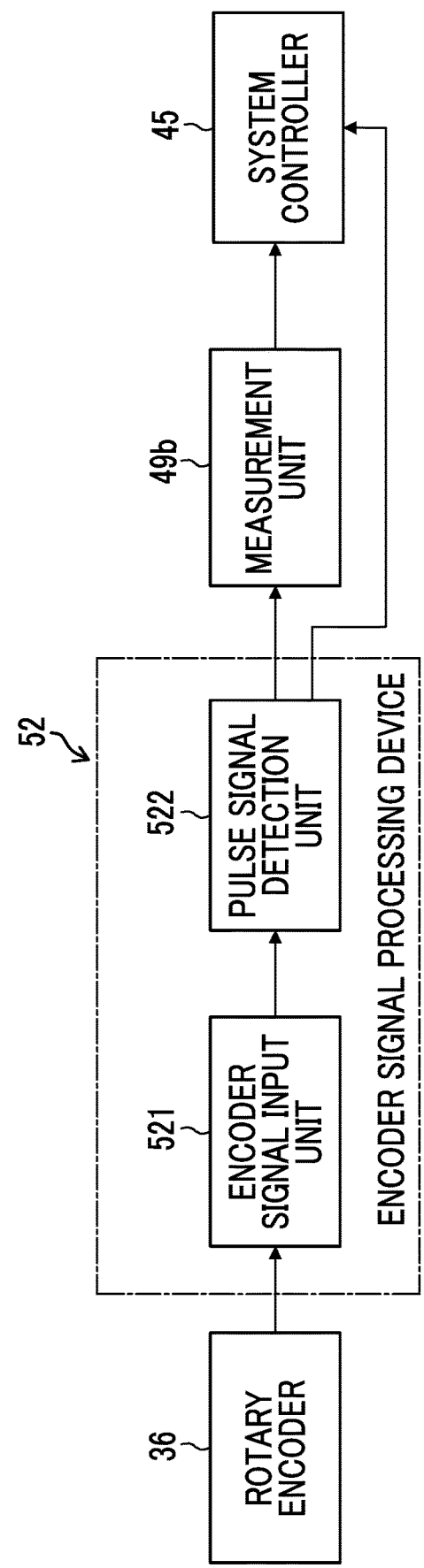
FIG. 14 is a block diagram showing an encoder signal processing device provided in the printer device.

FIG. 14 is a block diagram showing the encoder signal processing device 52 (FIG. 9) provided in the printer device 300.

As shown in FIG. 14, the encoder signal processing device 52 mainly includes an encoder signal input unit 521 and a pulse signal detection unit 522. The encoder signal processing device 52 may be formed of a digital circuit, or may be formed of one or a plurality of central processing units (CPU) provided in the printer device 300, encoder signal processing software, and the like.

The rotary encoder 36 outputs encoder signals including encoder pulse signals having a period corresponding to the rotational speed of the rotary slit plate 37 (capstan roller 35) (the transport speed of the instant film 10). Since 200 slits 37*a* (FIG. 6) are formed at the peripheral portion of the rotary slit plate 37 of this embodiment as described above, the rotary encoder 36 generates one encoder pulse signal whenever the capstan roller 35 is rotated by an angle of 1.8°.

The encoder signals are input to the encoder signal input unit 521 from the rotary encoder 36.

Figure 15:
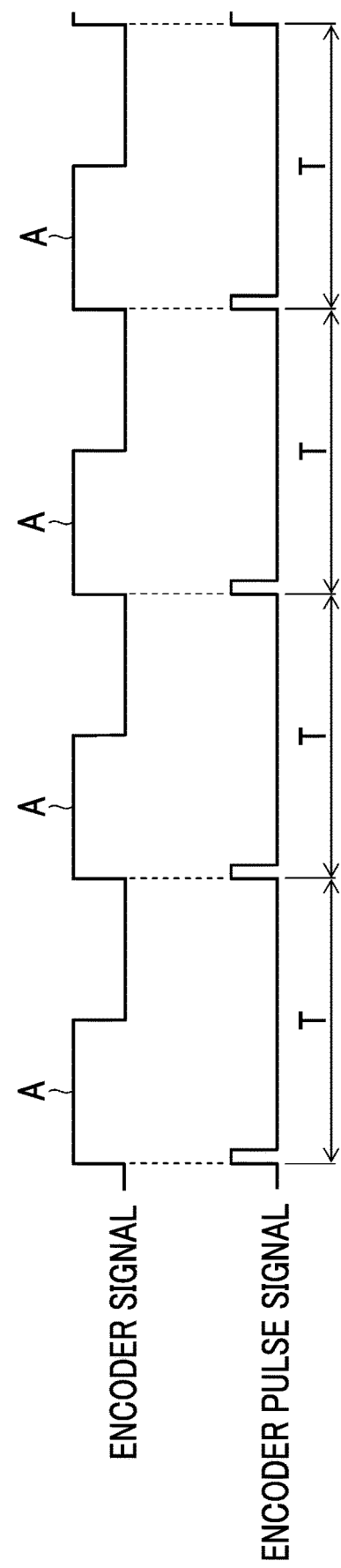
FIG. 15 is a diagram conceptually showing encoder signals and encoder pulse signals.

FIG. 15 is a diagram conceptually showing encoder signals and encoder pulse signals. The encoder signals shown in FIG. 15 include rectangular pulse signals A that are generated to correspond to the slits 37*a* of the rotary slit plate 37. The pulse signal detection unit 522 detects the pulse signals A from the encoder signals input to the encoder signal input unit 521 and outputs encoder pulse signals. Further, an encoder pulse time T, which is a time between the pulses of the encoder pulse signals, is measured on the basis of the encoder pulse signals, which are output from the encoder signal processing device 52, by the measurement unit 49*b*.

Detection of Exposure Start Position Using Encoder Pulse Signal

In the present invention, the system controller 45 outputs an exposure start signal to the exposure head drive unit 73 and the exposure control unit 47 on the basis of the above-mentioned encoder pulse signals.

First, the detection of an exposure start position and the detection of an exposure start position, which is performed in a printer in the related art (for example, a printer disclosed in WO2018/008223A described above)), will be described.

In a case where an instant film 10 is to be exposed to light while being transported, the exposure of the photosensitive surface 10a of the instant film 10 needs to be started at a correct position timing. For this reason, in order to detect an appropriate exposure start position in a printer device in the related art, a position where an instant film has passed by a distance calculated from a relationship between the respective dimensions (distances to the attachment positions of a film photointerrupter (PI) and the exposure head device 25 and the dimensions of the film) (a predetermined number of pulses has passed) from the detection of the start of passage performed in the film PI is detected as an exposure start position. That is, an exposure start position is detected in the printer device in the related art on the basis of two pieces of information that are a film PI and encoder pulse signals. However, in a case where the film PI is provided to be used for the detection of an exposure start position as described above, a space in which the film PI is to be provided is required in the printer device and cost for the printer device is additionally increased. Accordingly, in the present invention, a change in load during the transport of the instant film 10 is monitored on the basis of encoder pulse signals to detect an exposure start position. Therefore, components for a film PI are not required in the printer device, a space for a film PI in the printer device can be reduced, and manufacturing cost required to provide a film PI in the printer device can be reduced.

Monitoring a change in load during the transport of the instant film 10 on the basis of encoder pulse signals to detect an exposure start position will be described below.

The instant film 10 to be transported as described above enters the transport rollers (the capstan roller 35 and the pinch roller 39) and the spreading rollers 40 in order. Then, a change in load in the transport of the instant film 10 occurs at a time at which the instant film 10 enters. This change in load can be detected as a change in encoder pulse time via the capstan roller 35.

Figure 16:
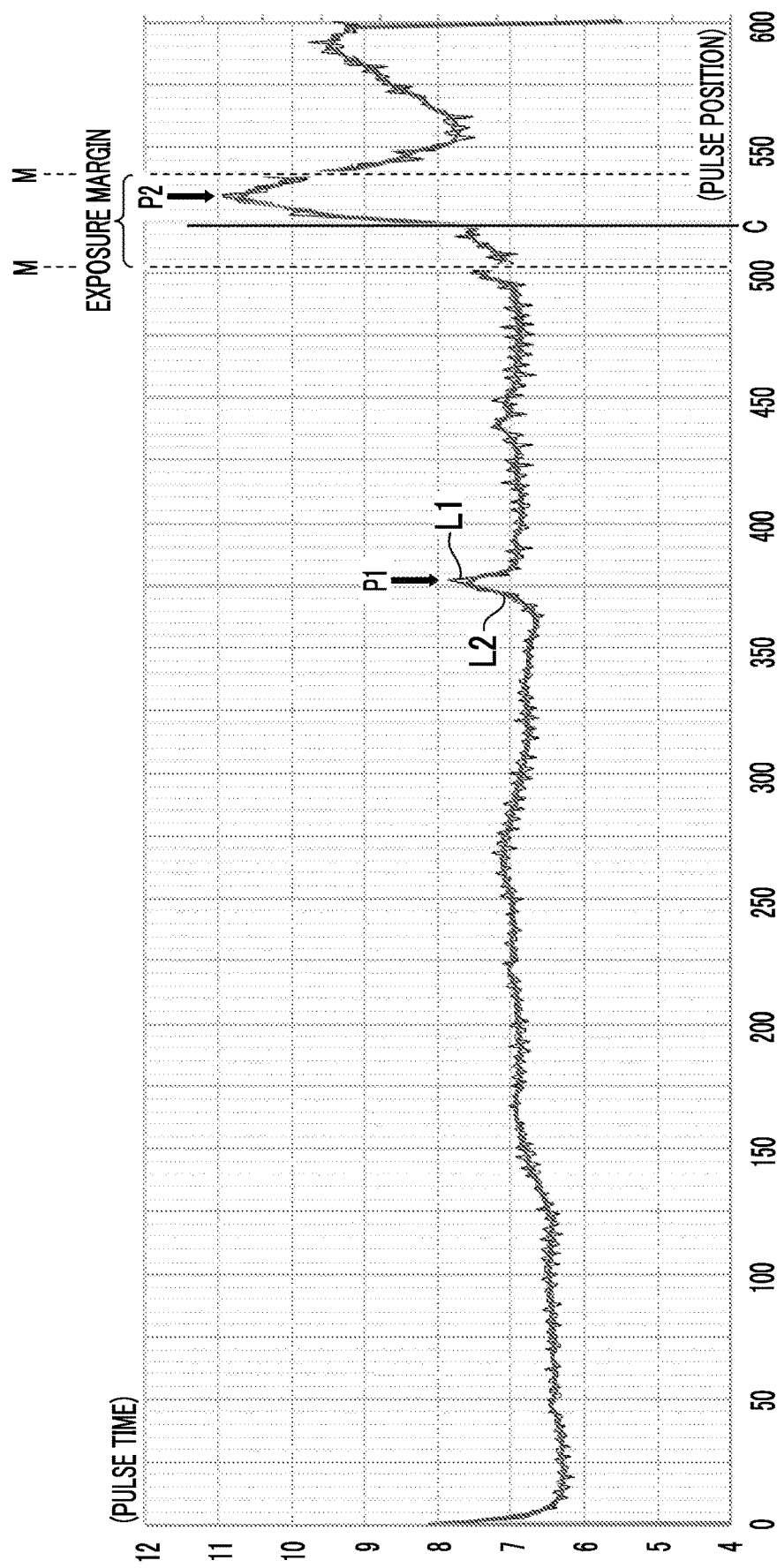
FIG. 16 is a diagram illustrating a change in encoder pulse time in the transport of the instant film.

FIG. 16 is a diagram illustrating a change in encoder pulse time in the transport of the instant film 10. In FIG. 16, a horizontal axis represents the number of pulses of encoder pulse signals and a vertical axis represents an encoder pulse time (milliseconds: ms). Further, in FIG. 16, a fine line L1 indicates an encoder pulse time T and a thick line L2 indicates an average of the encoder pulse time T.

A peak P1 shows a change in encoder pulse time at a time at which the instant film 10 enters the transport rollers. Further, a peak P2 shows a change in encoder pulse time at a time at which the instant film 10 enters the spreading rollers 40. As shown by the peaks P1 and P2, a load applied to the capstan roller 35 is increased and an encoder pulse time is increased at a time at which the instant film 10 enters the transport rollers or the spreading rollers 40. That is, the transport speed of the instant film 10 is reduced due to a change in transport load in this case. Furthermore, as shown by the peaks P1 and P2, an increase in load in a case where the instant film 10 enters the spreading rollers 40 is greater than an increase in load in a case where the instant film 10 enters the transport rollers. This is one of factors that cause the developer pod 14a of the instant film 10 to be split by the spreading rollers 40 as described above.

On the other hand, reference character C indicates a detected exposure start position in a case where a film PI is used as in the printer device in the related art. Specifically, after the passage of an instant film 10 is detected by the film PI, the number of pulses of encoder pulse signals is counted and an exposure start signal is output at a timing at which the count number of pulses reaches a predetermined number of pulses. Since the number of pulses of encoder pulse signals is counted on the basis of the detection signals of the film PI in this way, an exposure start signal can be output in a range M in which print can be started (exposure margin).

As shown in FIG. 16, in the printer device in the related art, a passage start signal of the instant film 10 output from the film PI is detected and the number of pulses of encoder pulse signals starts to be counted on the basis of the detected passage start signal. Then, an exposure start signal is output at a timing at which the count number of pulses reaches a predetermined number of pulses, so that exposure is started in the range M in which print can be started.

Figure 17:
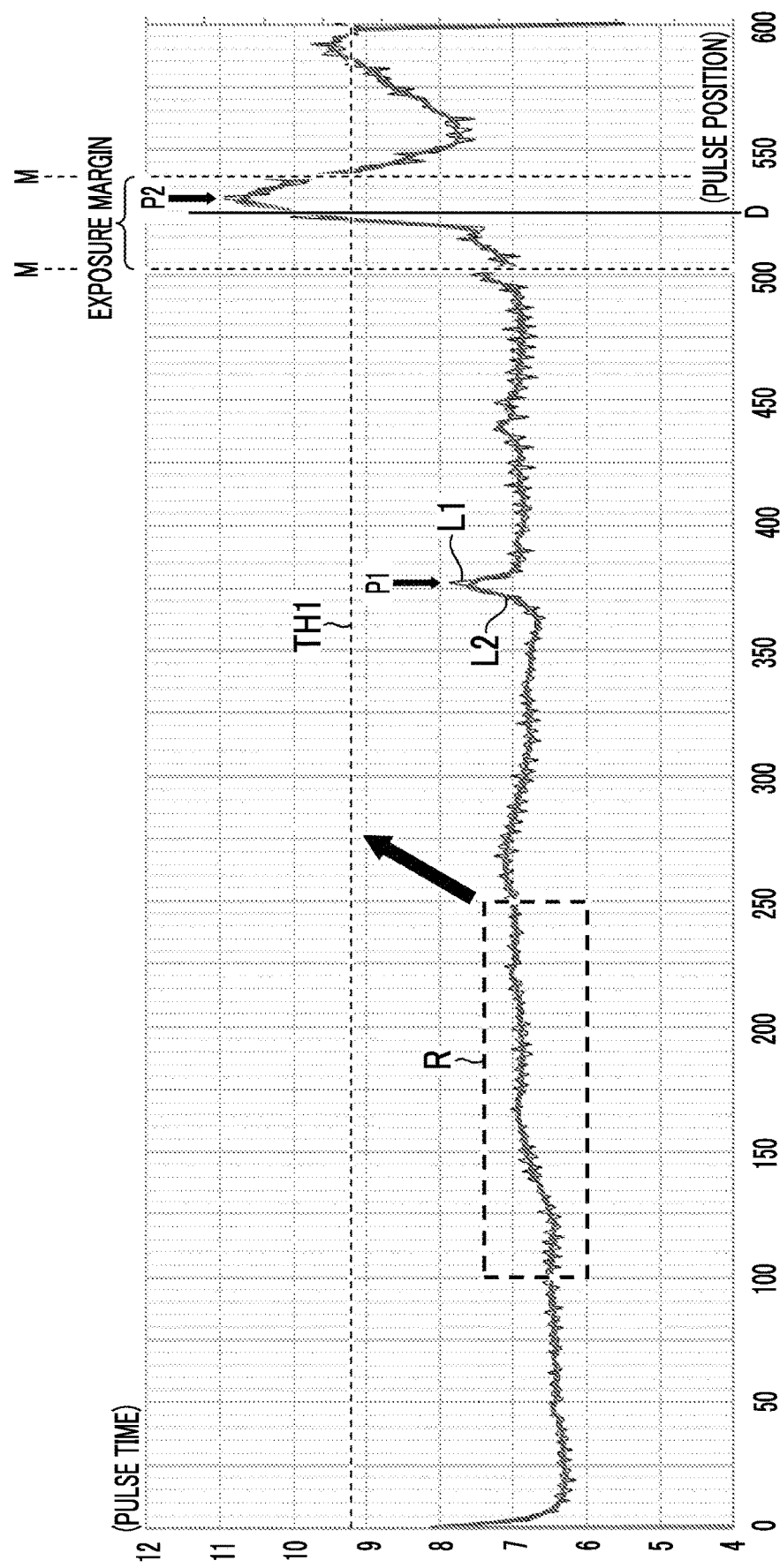
FIG. 17 is a diagram illustrating a change in encoder pulse time in the transport of the instant film.

FIG. 17 is a diagram illustrating a change in encoder pulse time in the transport of the instant film 10 as in FIG. 16, and is a diagram illustrating the output of an exposure start signal of the printer device 300 according to the embodiment of the present invention. The same portions as the portions in FIG. 16 will be denoted by the same reference numerals as those in FIG. 16 and the description thereof will be omitted. Further, an example in which a first threshold is set to detect a timing at which an exposure start signal is output will be described below.

As shown in FIG. 17, a first threshold (first threshold value) TH1 is set in an example of the present invention. A predetermined value may be employed as the first threshold, or the first threshold may be calculated on the basis of the value of an encoder pulse time in, for example, a period R (first period) (shown in FIG. 17) as described later.

The first threshold TH1 is a threshold value that is used to detect a timing at which an instant film 10 enters the spreading rollers 40. In a case where the encoder pulse time T exceeds the first threshold TH1, the system controller 45 determines that the instant film 10 has entered the spreading rollers 40 and then outputs an exposure start signal after a predetermined period. An example of the first threshold TH1, which is used to detect a timing at which the instant film 10 enters the spreading rollers 40 (to detect the peak P2), has been described in a case shown in FIG. 17, but a threshold value is not limited to the first threshold TH1. For example, a first threshold (first threshold value) TH2, which is used to detect a timing at which the instant film 10 enters the transport rollers (to detect the peak P1), may be set. Since a change in load tends to be larger at a timing at which the instant film 10 enters the spreading rollers 40 as shown in FIGS. 16 and 17, a timing at which the instant film 10 enters the spreading rollers 40 can be more accurately detected.

A specific example of the first threshold TH1 will be described.

Specific Example of First Threshold

A specific example of the first threshold TH1, which is used to detect a timing at which the instant film 10 enters the spreading rollers 40, will be described.

The first threshold TH1 of this embodiment is calculated from the following equation by the system controller 45.

$$\text{First threshold } TH1 = V_{ave} + \sigma \times n$$

In the above-mentioned equation, Vave, σ, and n are defined below.

Vave: an average speed (ms) in a range of the number of pulses counted from the start of receiving an encoder pulse signal that is 100 or more and 250 or less σ: a speed standard deviation in a range of the number of pulses counted from the start of receiving an encoder pulse signal that is 100 or more and 250 or less n: a coefficient (an integer of 1 or more) (for example, n=5)

The system controller 45 counts pulses from the start of receiving an encoder pulse signal on the basis of the first threshold TH1 calculated as described above, and immediately outputs an exposure start signal in a case where a speed after the 251st pulse exceeds the first threshold TH1 five times in a row. A case where a speed exceeds the first threshold TH1 five times in a row is described in this embodiment, but the specified number of times is set as appropriate.

Since a first threshold is calculated on the basis of an encoder pulse time obtained before the instant film 10 enters the transport rollers or the spreading rollers 40 as described above, an influence of a variation of an encoder pulse time depending on a drive voltage of the DC motor 30 can be suppressed.

Exposure Control

Figure 9:
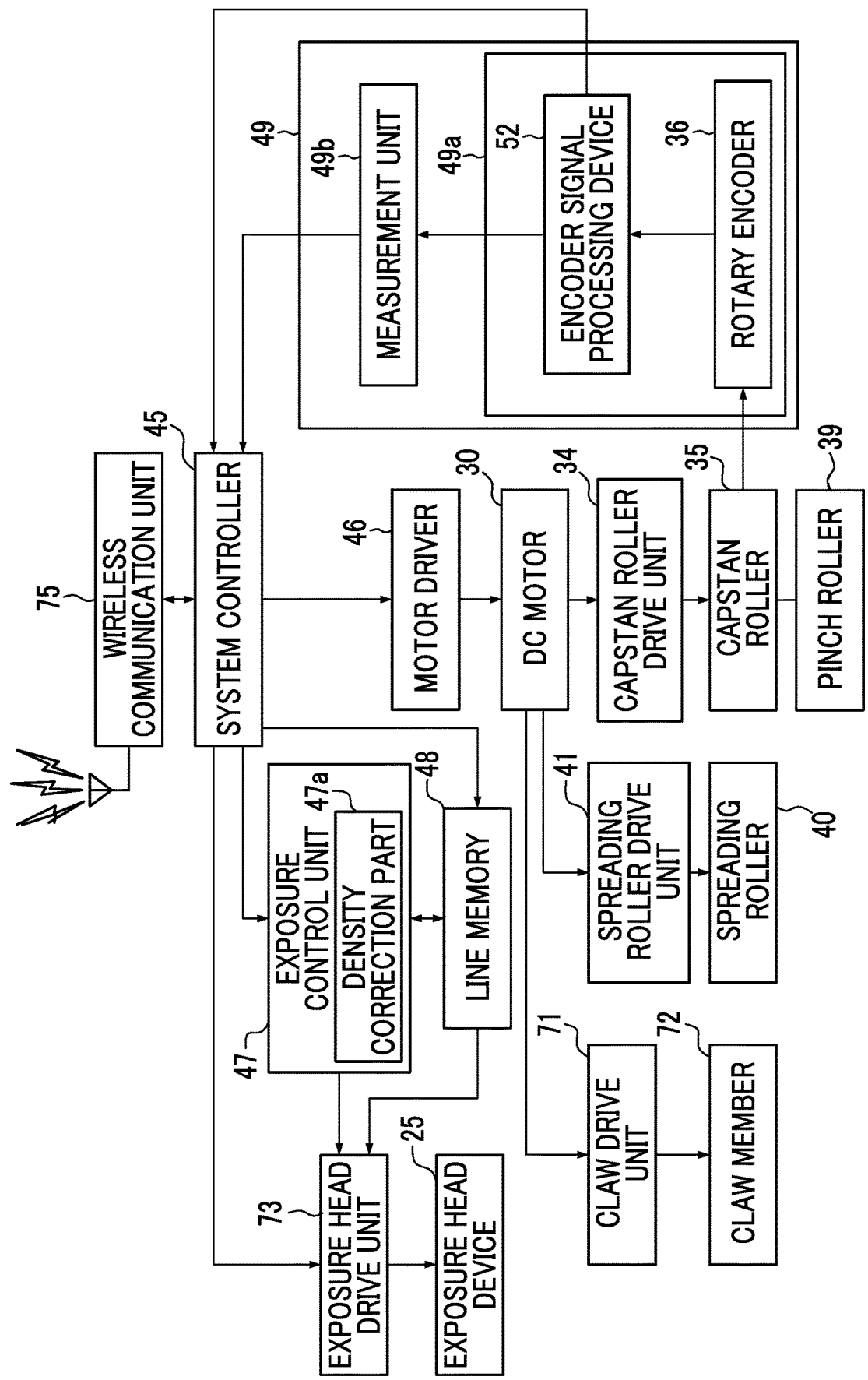
FIG. 9 is a block diagram showing a printer according to an embodiment of the present invention.

As shown in FIG. 9, the system controller 45 controls exposure, which is performed by the exposure head device 25 after the output of an exposure start signal, in synchronization with the encoder pulse signals input from the encoder signal processing device 52. Specifically, the system controller 45 drives the exposure head drive unit 73 in synchronization with the encoder pulse signals input from the encoder signal processing device 52 to control the exposure timing of the exposure head device 25 and to control the amount of each of red light, green light, and blue light emitted from the exposure head device 25 via the exposure control unit 47, the line memory 48, and the exposure head drive unit 73.

The system controller 45 sequentially supplies red, green, and blue image data for one line among image data, which are received via the wireless communication unit 75, to the line memory 48, and causes the line memory 48 to temporarily hold the red, green, and blue image data for one line.

Further, the system controller 45 has a function as a speed detection unit, obtains the current transport speed of the instant film 10 on the basis of the encoder pulse signals input from the encoder signal processing device 52, and outputs a transport speed signal, which indicates the obtained transport speed, to the exposure control unit 47.

The exposure control unit 47 includes a density correction part 47a, and outputs a pulse width modulation (PWM) signal to the exposure head device 25 so that the amount of light emitted from each LED of the exposure head device 25 is the amount of emitted light corresponding to each pixel value (for example, 0 to 255) of the image data. Here, the exposure control unit 47 outputs a PWM signal of which the pulse width is corrected by the density correction part 47a.

That is, the exposure control unit 47 generates a PWM signal that is obtained from the pulse width modulation of each pixel value of image data on the basis of the red, green, and blue image data for one line that are temporarily held in the line memory 48.

The density correction part 47a is a part for making a correction so that the density of an image to be printed on the instant film 10 is the same density as an image to be printed in a case where the instant film 10 is transported at a reference transport speed regardless of the transport speed of the instant film 10. The density correction part 47a corrects the pulse width of the generated PWM signal on the basis of a transport speed signal that is input from the system controller 45 and indicates the current transport speed of the instant film 10.

The density correction part 47a corrects the pulse width of the PWM signal such that the light emission time of the exposure head device 25 is shortened in a case where the transport speed of the instant film 10 is lower than a reference transport speed V0. The density correction part 47a corrects the pulse width of the PWM signal such that the light emission time of the exposure head device 25 is lengthened in a case where the transport speed of the instant film 10 is higher than the reference transport speed V0.

The PWM signal corrected by the density correction part 47a is output to the exposure head drive unit 73.

An exposure timing signal synchronized with encoder pulse signals is added to another input of the exposure head drive unit 73 from the system controller 45, and the exposure head drive unit 73 amplifies the PWM signal input from the exposure control unit 47 and outputs the amplified PWM signal to the exposure head device 25 in synchronization with the exposure timing signal input from the system controller 45.

The exposure head device 25 causes each LED of the exposure head device 25 to emit light on the basis of the PWM signal added from the exposure head drive unit 73, and simultaneously exposes the photosensitive surface 10a of the instant film 10 to three color lights.

Figure 18:
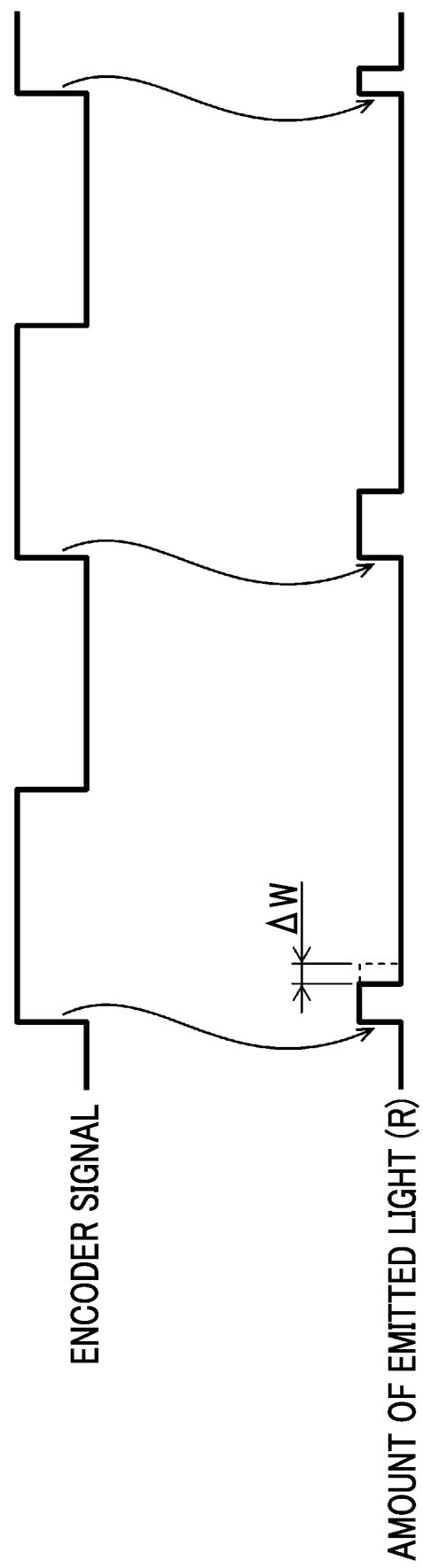
FIG. 18 is a diagram showing the exposure timing of an exposure head device that exposes the instant film to light in synchronization with an encoder pulse signals and the correction (density correction) of the amount of light emitted from the exposure head device.

FIG. 18 is a diagram showing the exposure timing of the exposure head device 25 that exposes the instant film to light in synchronization with the encoder pulse signals and the correction (density correction) of the amount of light emitted from the exposure head device. A PWM signal, which is used to control the light emission of one red (R) LED of the exposure head device 25, is shown in an example shown in FIG. 18.

As shown in FIG. 18, the exposure timing of the exposure head device 25 is controlled in synchronization with the encoder pulse signals (the rise of pulse signals).

Further, a transport speed V of the instant film 10 is lower than the reference transport speed V0 in the example shown in FIG. 18. As a result, a pulse width is corrected to be reduced by ΔW as compared to the pulse width of a PWM signal obtained in a case where the instant film 10 is transported at the reference transport speed V0. That is, a pulse width is corrected such that a light emission time is shortened by ΔW and the amount of emitted light is reduced.

The correction amount ΔW of the pulse width corresponds to the speed variation of the instant film 10 with respect to the reference transport speed V0.

On the other hand, in a case where the transport speed V of the instant film 10 varies such that the transport speed V is lower or higher than the reference transport speed V0, streak-like unevenness occurs at a portion where the transport speed V varies. However, since the correction (density correction) of the amount of emitted light according to the transport speed of the instant film 10 is performed by the density correction part 47a as described above, streak-like unevenness can be caused not to occur in an image (photographic print) printed on the instant film 10.

The instant film 10 is a positive sensitive instant film in this embodiment. However, since the correction of the amount of emitted light in the case of a negative sensitive instant film is opposite to that in the case of a positive sensitive instant film, the amount of light emitted from the exposure head device 25 is increased as the transport speed of, for example, a negative sensitive instant film is reduced.

Further, the amount of light emitted from the exposure head device 25 is controlled using the PWM signal (light emission time) in this embodiment, but the present invention is not limited thereto. The control of the amount of light emitted from the exposure head device 25 may be realized using the control of the intensity of light emitted from the exposure head or the control of both a light emission time and the intensity of emitted light.

Printing Method

Figure 19:
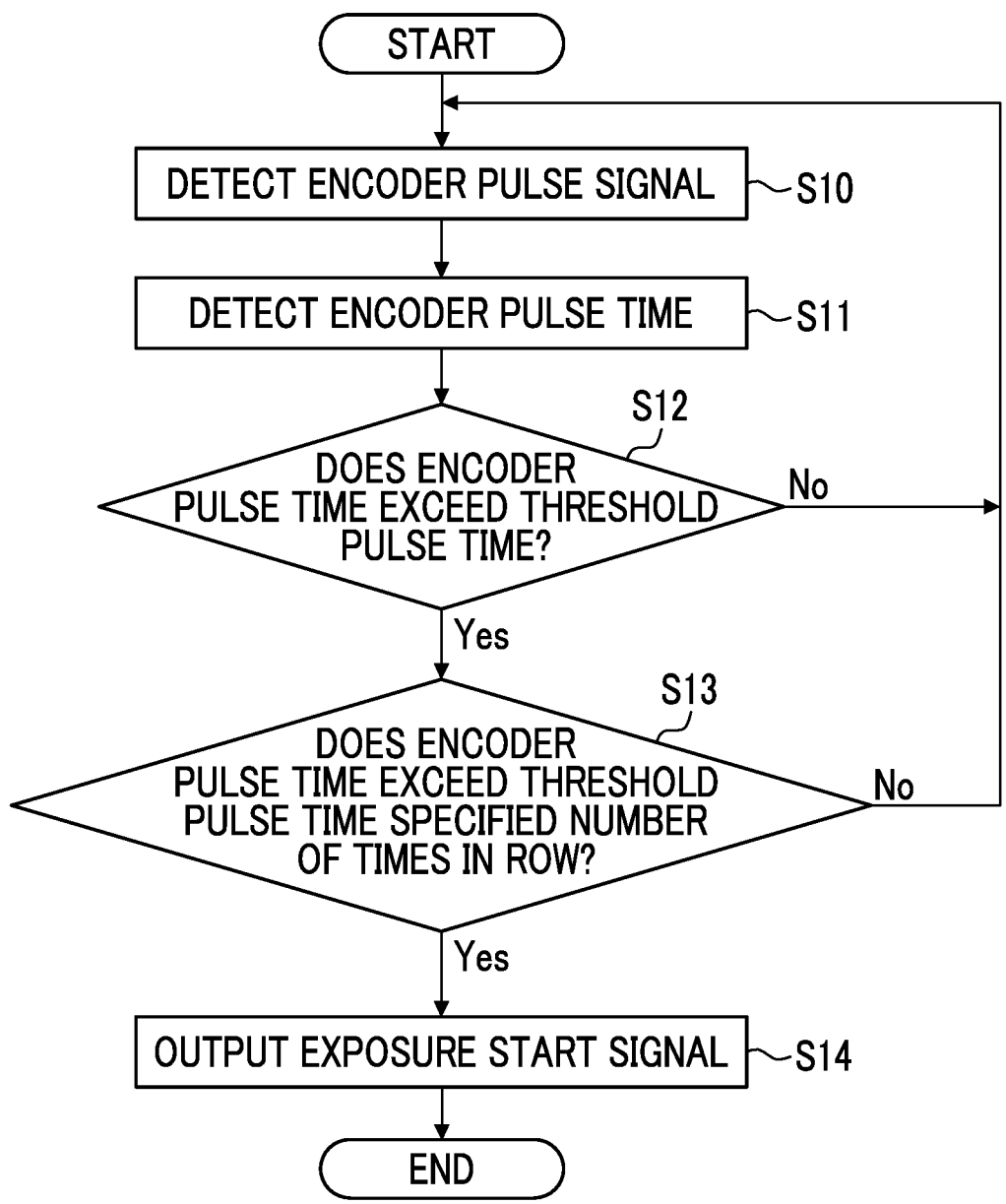
FIG. 19 is a flowchart showing a printing method of the printer device.

FIG. 19 is a flowchart showing a printing method of the printer device 300. In a case where the processor of the printer device 300 executes a dedicated program, each step of the printing method is performed. Further, an example in which a first threshold is set to detect a timing at which an exposure start signal is output will be described below.

First, the pulse signal detection unit 522 of the encoder signal processing device 52 detects an encoder pulse signal from an encoder signal output from the rotary encoder 36 (Step S10). Then, the measurement unit 49b detects an encoder pulse time T on the basis of the encoder pulse signal detected by the pulse signal detection unit 522 (Step S11). The encoder pulse time T detected by the measurement unit 49b is input to the system controller 45. The system controller 45 outputs an exposure start signal on the basis of a first threshold and the encoder pulse time T. Specifically, the system controller 45 determines whether or not the encoder pulse time T exceeds the first threshold (Step S12). In a case where the encoder pulse time T does not exceed the first threshold, the next encoder pulse signal and the next encoder pulse time T are detected. On the other hand, in a case where the encoder pulse time T exceeds the first threshold, the system controller 45 determines whether or not the encoder pulse time exceeds the first threshold a specified number of times in a row (Step S13). In a case where the encoder pulse time T does not exceed the first threshold the specified number of times in a row, the next encoder pulse signal and the next encoder pulse time T are detected. On the other hand, in a case where the encoder pulse time exceeds the first threshold the specified number of times in a row, the system controller 45 outputs an exposure start signal (Step S14).

According to this embodiment, as described above, an exposure start signal is output depending on the encoder pulse time calculated on the basis of the encoder pulse signal. Accordingly, in this embodiment, a change in load during the transport of the instant film 10 is monitored on the basis of encoder pulse signals to detect an exposure start position. Therefore, components for a film PI are not required in the printer device, a space for a film PI in the printer device can be reduced, and manufacturing cost required to provide a film PI in the printer device can be reduced.

Imaging Device With Printer Device

Figure 20:
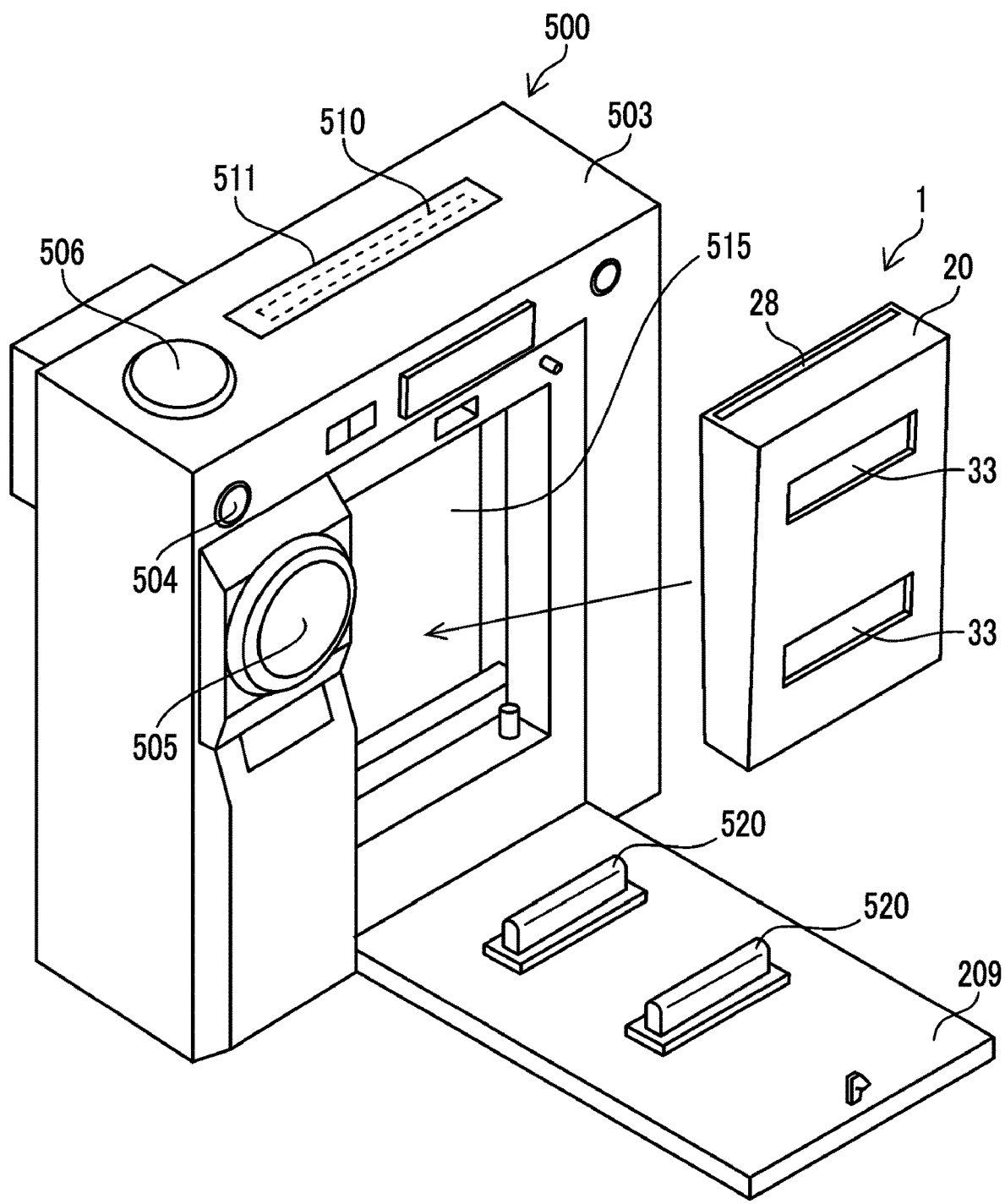
FIG. 20 is an external perspective view of a camera with a printer device (an imaging device with a printer device) according to another embodiment viewed from a front side.

FIG. 20 is an external perspective view of a camera 500 with a printer device (an imaging device with a printer device), to which the above-mentioned printer device is attached, according to another embodiment viewed from a front side. As in the printer device 300 (see FIG. 2), the camera 500 with a printer device is provided with a loading chamber 515, a film pack is loaded into the loading chamber, and the loading chamber 515 is closed with an openable and closable lid member 509. The same film cartridge 1 as that for the printer device 300 is used as the film pack. In a case where the film cartridge 1 is loaded and the lid member 509 is closed, push-up members 520 provided on the lid member 509 are inserted into the push-up member-insertion portions 33, push the light shielding sheet 50 (see FIG. 3) up to a front side (a side opposite to opening surfaces of the push-up member-insertion portions 33), and press instant films 10 against the inner surface of the case 20. The same components as the components of the printer device 300 will be denoted by the same reference numerals as the reference numerals of the components of the printer device 300 in the following description, and detailed description thereof will be omitted.

Camera Body

As shown in FIG. 20, an objective finder window 504, an imaging lens 505 with a zoom function, a release button 506, a strobe light-emitting portion, and a light-receiving window for photometry are exposed on the front surface of a camera body 503. Further, a central portion of the camera body 503 is provided with the lid member 509. A film discharge port 510 (a dotted line in FIG. 20) is provided on the upper surface of the camera body 503, and is usually closed by a lid 511 for a discharge port.

Configuration of Camera With Printer Device

Figure 21:
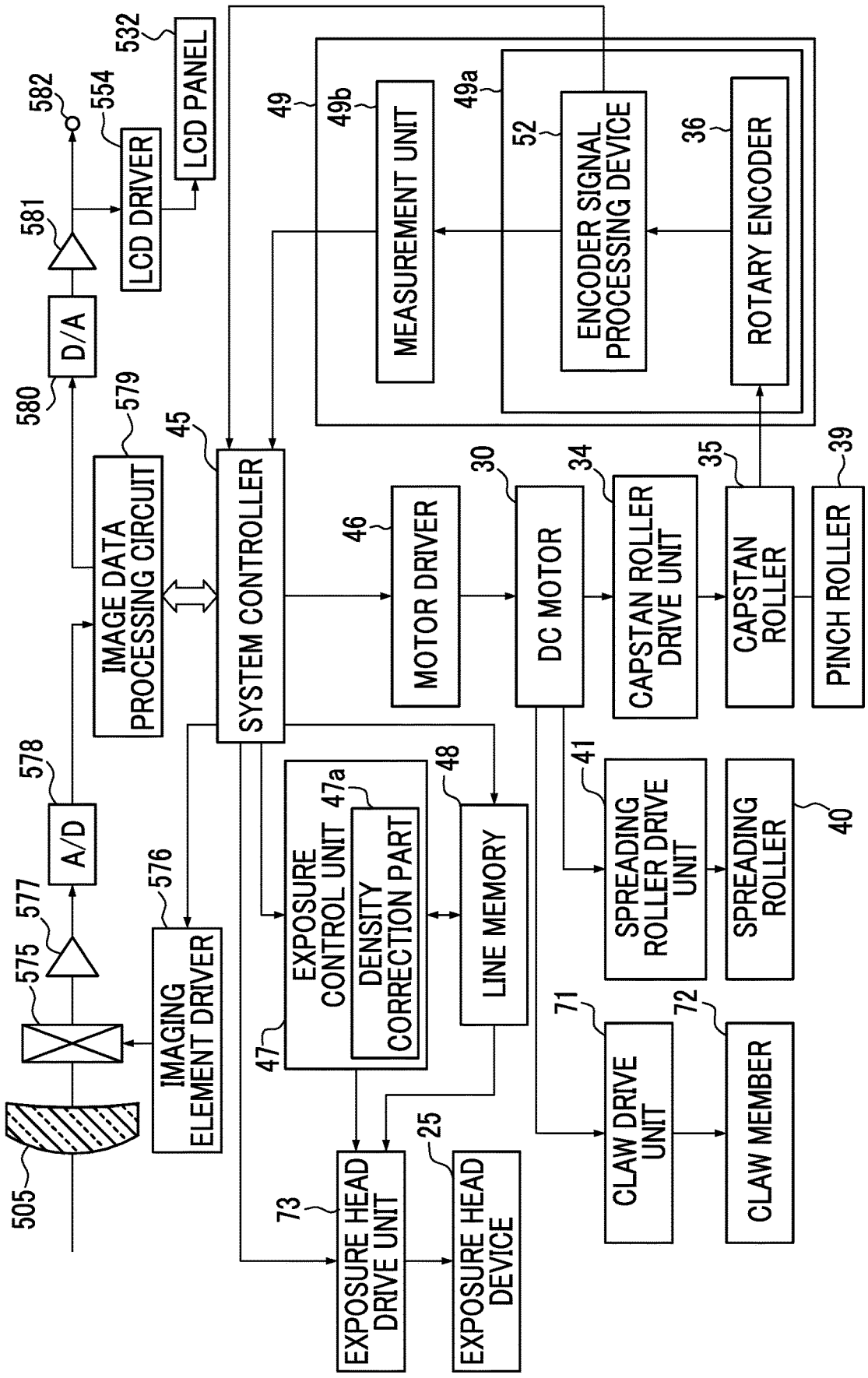
FIG. 21 is a block diagram showing the configuration of the camera with a printer device.

FIG. 21 is a block diagram showing the configuration of the camera 500 with a printer device. An imaging element 575 is disposed behind the imaging lens 505, and a subject image is formed on the light-receiving surface of the imaging element 575 by the imaging lens 505. The imaging element 575 is driven by an imaging element driver 576, converts an optical subject image into electrical imaging signals, and outputs the electrical imaging signals. A charge coupled device (CCD) imaging element and a complementary metal-oxide semiconductor (CMOS) imaging element can be used as the imaging element 575.

Red, green, and blue color filters are arranged in the form of a matrix on the photoelectric surface of the imaging element 575, and imaging signals output for each color are amplified by an amplifier 577 and are then converted into digital imaging signals by an analog to digital (A/D) converter 578. The A/D converter 578 converts the imaging signals into digital imaging signals to generate image data, and inputs the image data to an image data processing circuit 579.

The imaging lens 505, the imaging element 575, the imaging element driver 576, the A/D converter 578, and the image data processing circuit 579 functioning as an imaging unit form an image data input unit. An example in which analog signals are converted into digital signals has been described in this embodiment, but the application of a technique of the present disclosure is not limited thereto. For example, even in a case where subsequent processing is performed without converting analog signals into digital signals, the technique of the present disclosure is applied.

The image data processing circuit 579 performs signal processing, such as white balance adjustment and gamma correction, on input image data, outputs the image data to an output terminal 582 for video signals via a digital to analog (D/A) converter 580 and an amplifier 581, and outputs the image data to an LCD driver 554 to cause an LCD panel 532 to display a video. Further, the image data output from the image data processing circuit 579 are printed on the instant film 10 under the control of the system controller 45 by the exposure head device 25 and the like.

Detection Using Increment and Decrement of Pulse Time

An example in which a first threshold is set to detect a timing at which an exposure start signal is output has been described in the embodiment. However, in the present invention, a timing at which an exposure start signal is output can also be detected on the basis of the increment and the decrement of a pulse time.

In the following description, an example in which a timing at which an instant film 10 enters the transport rollers is detected and a timing at which an exposure start signal is output is detected on the basis of the increment and the decrement of a pulse time will be described.

In this embodiment, VmaxN (a position where the sum of the amount of deceleration and the amount of adjacent acceleration is maximum (a position of the speed variation peak of the pinch roller 39)) is detected in a certain pulse range by the system controller 45 and an exposure start signal is output after the number of pulses set from VmaxN passes.

VmaxN is a position (the number of pulses) where the sum of the amount of deceleration and the amount of adjacent acceleration is the maximum value (Vmax). Here, Vmax is the maximum value of "InteM+InteP" to be described below.

InteM: the amount of deceleration . . . a value obtained by integrating the absolute value of a negative-side value of a differential speed (moving average value [n+1]−moving average value [n−1]) in a pulse range of 250 to 400

InteP: the amount of acceleration . . . a value obtained by integrating the absolute value of a positive-side value of a differential speed (moving average value [n+1]−moving average value [n−1]) in a pulse range of 250 to 400

It is preferable that the moving average value is calculated as a half-width value of the peak P1 in a case where a peak P1 in a state where the instant film 10 enters the transport rollers in advance can be predicted.

Since a timing at which the instant film 10 enters the transport rollers is detected on the basis of the increment of a pulse time and the decrement of a pulse time in this embodiment as described above, an exposure start signal can be output at an appropriate timing.

Others

In the embodiment, the hardware structures of processing units, which perform various types of processing, (for example, the system controller 45, the exposure control unit 47, the encoder signal processing device 52, and the measurement unit 49*b*) are various processors to be described below. Various processors include: a central processing unit (CPU) that is a general-purpose processor functioning as various processing units by executing software (program); a programmable logic device (PLD) that is a processor of which the circuit configuration can be changed after manufacture, such as a field programmable gate array (FPGA); a dedicated electrical circuit that is a processor having circuit configuration dedicatedly designed to perform specific processing, such as an application specific integrated circuit (ASIC); and the like.

One processing unit may be formed of one of these various processors, or may be formed of two or more processors of the same type or different types (for example, a plurality of FPGAs or a combination of a CPU and an FPGA). Further, a plurality of processing units may be formed of one processor. As an example where a plurality of processing units are formed of one processor, first, there is an aspect where one processor is formed of a combination of one or more CPUs and software as typified by a computer, such as a client or a server, and functions as a plurality of processing units. Second, there is an aspect where a processor fulfilling the functions of the entire system, which includes a plurality of processing units, by one integrated circuit (IC) chip as typified by System On Chip (SoC) or the like is used. In this way, various processing units are formed using one or more of the above-mentioned various processors as hardware structures.

In addition, the hardware structures of these various processors are more specifically electrical circuitry where circuit elements, such as semiconductor elements, are combined.

Each configuration and function having been described above can be appropriately realized by arbitrary hardware, arbitrary software, or a combination of both arbitrary hardware and arbitrary software. For example, the present invention can also be applied to a program that causes a computer to perform the above-mentioned processing steps (processing procedure), a computer-readable recording medium (non-transitory recording medium) in which such a program is recorded, or a computer in which such a program can be installed.

The embodiment of the present invention has been described above, but it goes without saying that the present invention is not limited to the above-mentioned embodiment and may have various modifications without departing from the scope of the present invention.

EXPLANATION OF REFERENCES

1: film cartridge
10: instant film
10*a*: photosensitive surface
10*b*: observation surface
12: exposure portion
14: pod portion
14*a*: developer pod
16: trap portion
16*a*: absorbent material
18: observation portion
20: case
22: case body
22*a*: front portion
22*c*: bottom portion
24: case lid
25: exposure head device
26: exposure opening portion
27: film discharge guide
28: discharge port
29: case flap member
30: DC motor
31: film support portion
32: claw opening portion
32*a*: inlet portion
32*b*: passage portion
33: push-up member-insertion portion
34: capstan roller drive unit
35: capstan roller
35*a*: roller
35*c*: minute protrusion
36: rotary encoder
37: rotary slit plate
37*a*: slit
38: detection unit
39: pinch roller
40: spreading roller
40*a*: roller
40*b*: roller
41: spreading roller drive unit
42: light shielding sheet-attachment portion
45: system controller
46: motor driver
47: exposure control unit
47*a*: density correction part
48: line memory
49: load measuring device
49*a*: rotary encoder device
49*b*: measurement unit
50: light shielding sheet
52: encoder signal processing device
53: first light shielding sheet
53*b*: fixing portion
54: second light shielding sheet
60: film cover 62: notched portion
64: film cover-skirt part
71: claw drive unit
72: claw member
73: exposure head drive unit
75: wireless communication unit
100: printing system
200: smartphone
300: printer device
302: lid member
304: push-up member
311: film discharge port
315: loading chamber

What is claimed is:

1. A printer device comprising:
a loading chamber into which a film cartridge in which a film including a developer pod filled with a developer is housed is to be loaded;
an exposure head device that is disposed to face a photosensitive surface of the film discharged from the film cartridge and exposes the film to light;
a spreading roller that splits the developer pod of the film to spread the developer to the film;
a transport roller that transports the film;
a load measuring device that measures a change in load occurring in a case where the film enters at least the spreading roller or the transport roller; and
a processor that controls the exposure head device on the basis of a measurement result of the load measuring device,
wherein the load measuring device includes a rotary encoder device, the rotary encoder device is provided at an end portion of a rotating shaft of the transport roller and outputs a pulse signal according to a rotation of the transport roller, and
wherein the processor outputs an exposure start signal to the exposure head device on the basis of the measurement result of the load measuring device and causes the exposure head device to start to perform exposure, and the processor outputs the exposure start signal on the basis of a pulse time.

2. The printer device according to claim 1,
wherein the processor outputs the exposure start signal on the basis of the pulse time, which indicates a time interval between pulses of the pulse signal, and a first threshold value.

3. The printer device according to claim 2,
wherein the processor outputs the exposure start signal in a case where the pulse time exceeds the first threshold value a specified number of times in a row.

4. The printer device according to claim 2,
wherein the processor sets the first threshold value on the basis of the measurement result of the load measuring device obtained in a first period where the film does not yet enter the transport roller after the transport of the film is started from the film cartridge.

5. The printer device according to claim 2,
wherein the processor detects a timing at which the film enters the spreading roller on the basis of the measurement result, and outputs the exposure start signal.

6. The printer device according to claim 1,
wherein the processor outputs the exposure start signal on the basis of an increment and a decrement of the pulse time that indicates a time interval between pulses of the pulse signal.

7. The printer device according to claim 6,
wherein the processor detects a timing at which the film enters the transport roller on the basis of the measurement result, and outputs the exposure start signal.

8. The printer device according to claim 1,
wherein the processor controls exposure, which is performed by the exposure head device after the output of the exposure start signal, in synchronization with the pulse signal output from the rotary encoder device.

9. The printer device according to claim 1,
wherein an exposure range of the exposure head device in a width direction of the film is larger than the photosensitive surface of the film.

10. The printer device according to claim 1,
wherein the spreading roller is provided on a downstream side of the exposure head device in a transport direction of the film.

11. The printer device according to claim 1,
wherein the transport roller is disposed between the exposure head device and the spreading roller.

12. The printer device according to claim 1,
wherein an interval between the exposure head device and the spreading roller is equal to or less than an interval between the developer pod and the photosensitive surface of the film, the interval between the exposure head device and the spreading roller and the interval between the developer pod and the photosensitive surface of the film are in a film-transport direction.

13. The printer device according to claim 1, further comprising:
an imaging lens; and
an imaging element that captures an image of a subject formed by the imaging lens.

14. A camera with a printer device to which the printer device according to claim 1 is attached.

15. A printing method of a printer device including a loading chamber into which a film cartridge in which a film including a developer pod filled with a developer is housed is to be loaded, an exposure head device that is disposed to face a photosensitive surface of the film discharged from the film cartridge and exposes the film to light, a spreading roller that splits the developer pod of the film to spread the developer to the film, and a transport roller that transports the film, the printing method comprising:
measuring a change in load occurring in a case where the film enters at least the spreading roller or the transport roller by a load measuring device of the printer device; and
outputting an exposure start signal to the exposure head device on the basis of a measurement result of the load measuring device, to cause the exposure head device to start to perform exposure by a processor of the printer device,
wherein the processor controls the exposure head device on the basis of a measurement result of the load measuring device,
wherein the load measuring device includes a rotary encoder device, the rotary encoder device is provided at an end portion of a rotating shaft of the transport roller and outputs a pulse signal according to a rotation of the transport roller, and
wherein the processor outputs an exposure start signal to the exposure head device on the basis of the measurement result of the load measuring device and causes the exposure head device to start to perform exposure, and the processor outputs the exposure start signal on the basis of a pulse time.

16. A non-transitory, computer readable tangible recording medium which records thereon a program causing, when read by a computer, the computer to perform a printing method with a printer device including a loading chamber into which a film cartridge in which a film including a developer pod filled with a developer is housed is to be loaded, an exposure head device that is disposed to face a photosensitive surface of the film discharged from the film cartridge and exposes the film to light, a spreading roller that splits the developer pod of the film to spread the developer to the film, and a transport roller that transports the film, the method comprising:

measuring a change in load occurring in a case where the film enters at least the spreading roller or the transport roller, using a load measuring device of the printer device, and outputting an exposure start signal to the exposure head device on the basis of a measurement result of the load measuring device, to cause the exposure head device to start to perform exposure by a processor of the printer device, wherein the processor controls the exposure head device on the basis of a measurement result of the load measuring device, wherein the load measuring device includes a rotary encoder device, the rotary encoder device is provided at an end portion of a rotating shaft of the transport roller and outputs a pulse signal according to a rotation of the transport roller, and wherein the processor outputs an exposure start signal to the exposure head device on the basis of the measurement result of the load measuring device and causes the exposure head device to start to perform exposure, and the processor outputs the exposure start signal on the basis of a pulse time.

* * * * *